(12) United States Patent
Umezawa et al.

(10) Patent No.: US 6,333,662 B1
(45) Date of Patent: Dec. 25, 2001

(54) LATCH TYPE LEVEL SHIFT CIRCUIT

(75) Inventors: Akira Umezawa; Shigeru Atsumi, both of Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/468,924

(22) Filed: Dec. 22, 1999

(30) Foreign Application Priority Data

Dec. 24, 1998 (JP) .................................................. 10-367832

(51) Int. Cl.[7] ................................. H03L 5/00; G11C 7/00
(52) U.S. Cl. ........................... 327/333; 327/57; 327/225; 365/189.11; 365/228; 365/230.06; 365/230.08; 326/80
(58) Field of Search ......................... 365/189.09, 189.11, 365/228, 230.06, 230.08; 327/333, 51, 52, 57, 208, 225; 326/80, 81, 105, 106, 108

(56) References Cited

U.S. PATENT DOCUMENTS

| | | | |
|---|---|---|---|
| 5,371,705 | * 12/1994 | Nakayama et al. | 365/189.07 |
| 5,822,252 | * 10/1998 | Lee et al. | 365/230.05 |
| 5,903,171 | * 5/1999 | Shieh | 327/55 |
| 6,011,421 | * 1/2000 | Jung | 327/333 |

FOREIGN PATENT DOCUMENTS 8-51351    2/1996  (JP) ........................... H03K/19/0185

\* cited by examiner

Primary Examiner—Timothy P. Callahan
Assistant Examiner—Terry L. Englund
(74) Attorney, Agent, or Firm—Banner & Witcoff, Ltd.

(57) ABSTRACT

A latch type level shift circuit includes an internal power supply potential generating circuit for generating first and second internal power supply potentials; a latch circuit having first and second nodes and driven by the first and second internal power supply potentials; a level shifter having first and second output terminals and driven by the first internal power supply potential and a fixed potential; a first MOS transistor having a gate applied with the fixed potential; and a second MOS transistor having a gate applied with the fixed potential. The first MOS transistor is connected between the first node and the first output terminal, and the second MOS transistor is connected between the second node and the second output terminal. The internal power supply potential generating circuit may be used to change the values of the first and second internal power supply potentials by setting the first internal power supply potential to the fixed potential and by setting the second internal power supply potential to a negative potential at the time of an erase operation.

28 Claims, 13 Drawing Sheets

LATCH TYPE LEVEL SHIFT CIRCUIT

BACKGROUND OF THE INVENTION

This invention relates to a latch type level shift circuit and more particularly to a latch type level shift circuit used for a row decode circuit.

Recently, a flash EEPROM has received much attention as a nonvolatile semiconductor memory which can be integrated with high integration density. The memory has a feature that data items of memory cells can be instantaneously erased in a lump in the unit of block.

As the flash EEPROM, a NOR type, NAND type and the like are known. In any type of flash EEPROM, the cell structure may be generally formed of a stack type by stacking a plurality of polysilicon layers to form a floating gate electrode and control gate electrode.

FIG. 1 shows the main portion of a NOR type flash EEPROM as an example of the flash EEPROM.

A memory cell array 11 has a plurality of memory cells MC arranged in an array form. For example, the memory cell MC has a stack type cell structure as shown in FIG. 2. A plurality of word lines WL0, WL1, . . . , WLn extending in the row direction and a plurality of bit lines BL0, BL1, . . . , BLm extending in the column direction are arranged on the memory cell array 11.

For example, a plurality of row decode circuits RD•0, R•1, . . . , RD•n are respectively provided for the plurality of word lines WL0, WL1, . . . , WLn. One end of the word line WLi (i is 0, 1, . . . , n) is connected to the corresponding row decode circuit RD•i.

A column selecting circuit 12 is connected to the plurality of bit lines BL0, BL1, . . . , BLm and selects one of the columns based on an output signal from a column decode circuit CD. The bit line on the selected column is electrically connected to an input register 13 or sense amplifier 14. An input/output buffer 15 is provided to transfer data between the interior and the exterior of the memory chip.

A row address signal is input to the plurality of row decode circuits RD•0, RD•1, . . . , RD•n via an address register 16. A column address signal is input to the column decode circuit CD via the address register 16.

FIG. 3 shows one example of the row decode circuit and a control circuit therefore.

The row decode circuit RD•i is constructed by a row decoder 29 and latch type level shift circuit 30.

The row address signal is input to the row decoder 29 via the address register 16. The row decoder 29 supplies decode signals Ai, $\overline{Ai}$ indicating the result of decoding of the row address signal to the latch type level shift circuit 30. When the row containing the word line WLi is selected, the decode signal Ai is set to "H" and the decode signal $\overline{Ai}$ is set to "L".

A write enable signal $\overline{WE}$, chip enable signal $\overline{CE}$ and command signal are input to a mode select circuit 23. The mode select circuit 23 supplies erase signals ERASE*, $\overline{ERASE^*}$ to the latch type level shift circuit 30.

A potential generating circuit (booster or charge pump circuit) 24 outputs VROW (positive potential or ground potential). VROW is supplied to the latch type level shift circuit 30 via a regulator 25. A potential generating circuit (booster or charge pump circuit) 26 outputs VBB (ground potential or negative potential). VBB is supplied to the latch type level shift circuit 30 via a regulator 27.

A negative potential detecting circuit 28 detects the value of VBB, sets VBBDET to "H" when VBB is lower than a preset value (for example, −4V) and sets VBBDET to "L" when VBB is higher than the preset value. Further, it sets $\overline{VBBDET}$ to the same value as VBB when VBB is set at a negative potential and sets $\overline{VBBDET}$ to "H" when VBB is set at a ground potential.

FIG. 4 shows one example of the row decoder.

The row decoder includes a NAND circuit 17 supplied with a row address signal and an inverter circuit 18. The NAND circuit 17 outputs a decode signal $\overline{Ai}$ and the inverter circuit 18 outputs a decode signal Ai.

FIG. 5 shows one example of the latch type level shift circuit 30.

A latch circuit constructed by inverter circuits INV1, INV2 is connected between nodes A and B. The node B is connected to the input terminal of an inverter circuit INV4. An output signal OUT of the inverter circuit INV4 is supplied to the word line WLi. A signal VBBDET is input to an inverter circuit INV3 and an internal power supply potential VROW' is output from the inverter circuit INV3. The internal power supply potentials VROW', VBB are supplied to the inverter circuits INV1, INV2, INV4.

N-channel MOS transistors MN1, MN3 are serially connected between the node A and a ground node VSS and N-channel MOS transistors MN2, MN4 are serially connected between the node B and the ground node VSS. The gates of the MOS transistors MN3, MN4 are supplied with a signal $\overline{VBBDET}$.

The signal $\overline{VBBDET}$ is set to the same value as VBB when VBB is set at a negative potential and is set to "H" when VBB is set at the ground potential.

The gate of the MOS transistor MN1 is supplied with an output signal VAB of a NOR circuit 21 and the gate of the MOS transistor MN2 is supplied with a signal VA obtained by inverting the output signal VAB of the NOR circuit 21 by use of an inverter circuit 22. Output signals of AND circuits 19, 20 are input to the NOR circuit 21. The AND circuit 19 is supplied with the decode signal Ai and erase signal $\overline{ERASE^*}$ and the AND circuit 20 is supplied with the decode signal $\overline{Ai}$ and erase signal ERASE*.

In the flash EEPROM with the above construction, generally, the selected word line is applied with a positive or negative high potential. For example, at the time of program (the operation for injecting electrons into the floating gate electrode), a potential of approx. 9V is applied to the selected word line, and at the time of erase (the operation for extracting electrons from the floating gate electrode), a potential of approx. −9V is applied to the selected word line. In this case, 0V is applied to the non-selected word lines.

In the present example, the level shift circuit is formed as a latch type. Further, in order to prevent positive and negative high potentials from being simultaneously applied to the inverter circuit, the power supply potential applied to the inverter circuit is changed.

For example, when VROW' is output to the selected word line, VROW' (for example, 9V) and VBB (for example, 0V) are applied to the inverter circuit, and when VBB is applied to the selected word line, VROW' (for example, 0V) and VBB (for example, −9V) are applied to the inverter circuit.

Next, the operation of the flash EEPROM of FIGS. 1 to 5 is explained.

Program Operation (Pre-Program Operation)

First, ERASE* is set to "L", $\overline{ERASE^*}$ is set to "H", VROW is set to 9V and VBB is set to 0V. Since VBB is set at 0V, the negative potential detecting circuit outputs VBB-DET of "L".

Since all of the row address signals are set at "H" in the row decoder RD•i of the selected row, Ai is set to "H" and $\overline{Ai}$ is set to "L". At this time, the output signal VAB of the NOR circuit 21 is set to "L" and the output signal VA of the inverter circuit 22 is set to "H". As a result, the MOS transistor MN1 is set into the OFF state and the MOS transistor MN2 is set into the ON state.

Since $\overline{VBBDET}$ is set at "H", the MOS transistors MN3, MN4 are set in the ON state. Therefore, the ground potential Vss is transmitted to the node B of the latch circuit. That is, a potential VLB of the node B of the latch circuit is set to VBB or "L (=0V)", a potential VLA of the node A is set to VROW' or "H (=9V)", and the state of the latch circuit is determined. Since the potential VLB of the node B is set at "L", the output signal OUT of the inverter circuit INV4 is set to "H (=9V)".

When VBBDET is set at "L", the internal power supply potential VROW' (=VROW=9V) is supplied to the inverter circuits INV1, INV2, INV4. Therefore, the output signals of the inverter circuits INV1, INV4 are set to "H (=9V)".

Then, the output signal OUT (=9V) of the inverter circuit INV4 is applied to the selected word line WLi and if the potential is maintained for a preset period of time, the program operation (pre-program operation) for injecting electrons into the floating gate electrode is effected.

For example, the above program operation is repeatedly effected according to the sequence of FIG. 7 until the program operation for all of the memory cells is completed.

In the normal program operation, a "0" program operation (the operation for injecting electrons into the floating gate electrode) and a "1" program operation (the operation for maintaining the erase state) are provided. The pre-program operation is to equalize the threshold voltages of the memory cells prior to the erase operation in order to prevent over erase and corresponds to the "0" program operation.

Since all of the row address signals are not set at "H" in the row decoder RD•i of the non-selected row, Ai is set to "L" and $\overline{Ai}$ is set to "H". At this time, the output signal VAB of the NOR circuit 21 is set to "H" and the output signal VA of the inverter circuit 22 is set to "L". As a result, the MOS transistor MN1 is set into the ON state and the MOS transistor MN2 is set into the OFF state.

Since $\overline{VBBDET}$ is set at "H", the MOS transistors MN3, MN4 are set in the ON state. Therefore, the ground potential Vss is transmitted to the node A of the latch circuit. That is, the potential VLA of the node A of the latch circuit is set to VBB or "L (=0V)", the potential VLB of the node B is set to VROW' or "H (=9V)", and the state of the latch circuit is determined. Since the potential of the node B is set at "H", the output signal OUT of the inverter circuit INV4 is set to "L (=0V)". The output signal OUT is applied to the non-selected word lines.

In the program operation, a voltage of VROW'-VBB=9V is applied to the inverter circuits INV1, INV2, INV4.

Erase Operation

The erase operation is explained with reference to the signal waveforms of FIG. 6.

First, in the initial state (period (1)), ERASE* is set at "H", $\overline{ERASE^*}$ is set at "L", VROW is set at 4V and VBB is set at 0V. Since VBB is set at 0V, the negative potential detecting circuit 28 outputs VBBDET="L (0V)".

Since all of the row address signals are set at "H" in the row decoder of the selected row, Ai is set at "H" and $\overline{Ai}$ is set at "L". At this time, the output signal VAB of the NOR circuit 21 is set to "H" and the output signal VA of the inverter circuit 22 is set to "L". As a result, the MOS transistor MN1 is set into the ON state and the MOS transistor MN2 is set into the OFF state.

Since $\overline{VBBDET}$ is set at "H", the MOS transistors MN3, MN4 are set in the ON state. Therefore, the ground potential Vss is transmitted to the node A of the latch circuit. That is, the potential VLA of the node A of the latch circuit is set to VBB or "L (=0V)", the potential VLB of the node B is set to VROW' or "H (=4V)", and the state of the latch circuit is determined. Since the potential of the node B is set at "H", the output signal OUT of the inverter circuit INV4 is set to "L (=0V)".

Since all of the row address signals are not set at "H" in the row decoder of the non-selected row, Ai is set to "L" and $\overline{Ai}$ is set to "H". At this time, the output signal VAB of the NOR circuit 21 is set to "L" and the output signal VA of the inverter circuit 22 is set to "H". As a result, the MOS transistor MN1 is set into the OFF state and the MOS transistor MN2 is set into the ON state.

Since $\overline{VBBDET}$ is set at "H", the MOS transistors MN3, MN4 are set in the ON state. Therefore, the ground potential 0V (VSS) is transmitted to the node B of the latch circuit. That is, the potential VLB of the node B of the latch circuit is set to VBB or "L (=0V)", the potential VLA of the node A is set to VROW' or "H (=4V)", and the state of the latch circuit is determined. Since the potential of the node B is set at "L", the output signal OUT of the inverter circuit INV4 is set to "H (=4V)".

After this, if ERASE is changed from "L" to "H", the potential generating circuit (booster or charge pump circuit) 26 gradually lowers VBB from 0V towards –9V (period (2)).

At this time, if the MOS transistors MN3, MN4 are kept in the ON state, the ground node VSS and the VBB terminal of the inverter circuit INV1 are short-circuited via the MOS transistor MN3 and node A in the selected row and the ground node VSS and the VBB terminal of the inverter circuit INV2 are short-circuited via the MOS transistor MN4 and node B in the non-selected row, thereby causing a leak current to flow.

If VBB is set at a negative potential, the negative potential detecting circuit 28 changes $\overline{VBBDET}$ from "H" (4V) to VBB. $\overline{VBBDET}$ is an inverted signal of VBBDET, but in a period in which VBB is set at a negative potential, $\overline{VBBDET}$ is changed to VBB irrespective of VBBDET.

Further, if $\overline{VBBDET}$ is set equal to VBB, the above leak current can be eliminated since the MOS transistors MN3, MN4 are always kept in the cut-off state.

In a period (3), that is, when VBB becomes lower than –4V, the negative potential detecting circuit 28 outputs VBBDET ="H". At this time, VROW (=VROW') is changed from 4V to 0V. In other words, the "H" level of each of the inverter circuits INV1, INV2, INV4 is set to 0V and the "L" level is set to VBB.

After this, if VBB reaches –9V, a negative high potential (–9V) is applied to the selected word line. If the potential is kept applied to the selected word line for a preset period of time, electrons in the floating gate electrode of the selected memory cell are discharged into the substrate or source.

At the time of erase operation, the maximum voltage applied to the inverter circuits INV1, INV2, INV4 is set to VROW' (0V)–VBB (–9V) =9V. The voltage is the same as the maximum voltage applied to the inverter circuits INV1, INV2, INV4 at the time of program operation.

If ERASE is set to "L", the erase operation is terminated and the potential generating circuit (booster or charge pump circuit) 26 tends to return VBB from –9V to the ground potential (0V). At the same time, $\overline{VBBDET}$ changes in the same manner as VBB.

In a period (4), that is, when VBB exceeds –4V, the negative potential detecting circuit 28 changes VBBDET from "H" to "L". At this time, VROW (=VROW') is returned to 4V from 0V.

When VBB is set to 0V (period (5)), the negative potential detecting circuit 28 returns $\overline{\text{VBBDET}}$ to VROW (=4V). The state in the period (5) is the same as the initial state (the state in the period 1)), and the above erase operation is repeatedly effected according to the sequence of FIG. 7, for example, until the erase operation for all of the memory cells is completed.

The conventional latch type level shift circuit described above has the following defects.

First, the following defect associated with prevention of the leak current at the time of generation of the negative potential is given.

The negative potential detecting circuit supplies VBB to the gate electrodes of the N-channel MOS transistors MN3, MN4 used as the transfer gates when VBB is set at the negative potential. As a result, even if VBB is set to a negative potential, the MOS transistors MN3, MN4 are cut off and a leak current can be prevented from flowing.

However, in this case, in order to prevent the leak current flow, it is necessary to control the ON/OFF states of the MOS transistors MN3, MN4 by logically effecting the control operation for setting $\overline{\text{VBBDET}}$ to "H (=4V)" when VBB is set at 0V and setting $\overline{\text{VBBDET}}$ to the same value as VBB when VBB is set at a negative potential.

Therefore, the conventional latch type level shift circuit has a defect that the negative potential detecting circuit becomes complicated in construction and the circuit scale thereof becomes large.

Second, the following defect associated with the read operation (verify operation) is given.

In the flash EEPROM, for example, the erase verify operation for verifying whether data of the memory cell is correctly erased or not is effected after the erase operation. At the time of verify read, for example, as shown in FIG. 8, a read potential Vread is applied to the control gate electrode of a memory cell selected to be verified and a ground potential (0V) is applied as a read inhibition potential to the control gate electrodes of non-selected memory cells.

At this time, the relation between the state ("0" or "1") of the memory cell and the threshold voltage Vth as shown in FIG. 9 is obtained and the non-selected memory cell is set in the OFF state in principle. Therefore, whether data of the selected memory cell is correctly erased or not (whether it is set to the "1" state or not) can be easily determined by detecting whether the selected memory cell is set into the ON state or kept in the OFF state.

However, for example, the erase characteristics (the ease with which data can be erased) of the memory cells are different for each memory cell according to process fluctuations in the control gate electrodes and floating gate electrodes in the manufacturing process as shown in FIG. 10. Therefore, a memory cell having a good erase characteristic will be set into an over erase state (the threshold voltage becomes negative) in some cases after data items of all of the memory cells are erased.

In this case, as shown in FIG. 11, if the non-selected memory cell in the over erase state is connected to the same bit line as the bit line BLi to which the selected memory cell is connected, the non-selected memory cell is set into the ON state, thereby discharging the precharge potential of the bit line BLi. Therefore, the bit line potential is discharged irrespective of the state in which data of the selected memory cell is correctly erased or not and the result of verify indicating that the erase operation is completed is always attained.

In order to prevent this phenomenon, for example, a potential (for example, −2V) lower than 0V may be applied to the non-selected word line so as to prevent the memory cell set in the over erase state and connected to the same bit line as that to which the selected memory cell is connected from being set into the ON state. With this, for example, at the time of verify read, the memory cell in the over erase state can be prevented from being set into the ON state.

However, the operation for applying the negative potential (for example, −2V) to the non-selected word line at the time of verify operation requires the following control operation.

(1) An address is set and latched (time tset).

(2) The VBB terminal of the inverter circuit is disconnected from the ground node and a negative potential (−2V) generated from the negative potential generating circuit is applied to the VBB terminal (time tiso).

(3) Verify read is performed (time tev).

(4) The VBB terminal of the inverter circuit is connected to the ground node (time tiso).

(5) The state of (1) is restored (time tset).

The above-described verify operation has a feature that the operations of (2) and (4) are newly added in comparison with the normal verify operation. The operations of (1) to (5) are based on substantially the same sequence as the erase operation.

Since the erase operation is effected collectively and simultaneous for all of the memory cells, the erase sequence is effected by one time when data erase is effected for all of the memory cells by one time. However, the verify operation is effected for each memory cell. Therefore, when the verify operation is effected for all of the memory cells by one time, the above sequence is effected by the number of times equal to the number of rows (the number of word lines).

For example, in a case where 1024 rows are present in one memory cell array (or block) and if verify read is effected for all of the memory cells by one time, the total time becomes 1024×(2×tset+2×tiso+tev).

Thus, in order to prevent a leak current from flowing due to an over erase cell at the read time (at the verify time), the control operation by the sequence of (1) to (5) described above is required, thereby causing a problem that the operation control becomes complicated and the verify time becomes excessively long.

BRIEF SUMMARY OF THE INVENTION

This invention has been made in order to solve the above problem and an object of this invention is to provide a latch type level shift circuit capable of preventing a leak current from flowing from the ground node VSS into the VBB terminal without effecting the complicated control operation at the time of generation of the negative potential VBB and supplying a negative potential to the control gate electrode of a non-selected cell to prevent a leak current from flowing due to an over erase cell by a simple control operation at the read time (verify time).

In order to attain the above object, a latch type level shift circuit of this invention comprises an internal power supply potential generating circuit for outputting first and second internal power supply potentials; a latch circuit having first and second nodes and driven by the first and second internal power supply potentials; a level shifter having first and second output terminals and driven by the first internal power supply potential and a fixed potential; a first MOS transistor having a gate which is applied with the fixed potential and connected between the first node and the first output terminal; and a second MOS transistor having a gate which is applied with the fixed potential and connected between the second node and the second output terminal.

A latch type level shift circuit of this invention comprises an internal power supply potential generating circuit for outputting first and second internal power supply potentials; a latch circuit having first and second nodes and driven by the first and second internal power supply potentials; a level shifter having first and second output terminals and driven by the first internal power supply potential and a fixed potential; a first MOS transistor having a gate connected to the first output terminal and having a function of supplying the first internal power supply potential to the first node when it is set into the ON state; and a second MOS transistor having a gate connected to the second node and having a function of supplying the first internal power supply potential to the second node when it is set into the ON state.

The internal power supply potential generating circuit changes the values of the first and second internal power supply potentials and sets the first internal power supply potential to the fixed potential and sets the second internal power supply potential to a negative potential at the time of an erase operation.

The latch type level shift circuit of this invention further comprises a switch circuit for setting the first and second output terminals to the fixed potential when the first internal power supply potential is set at the fixed potential.

The internal power supply potential generating circuit changes the values of the first and second internal power supply potentials and sets the second internal power supply potential to a negative potential at the time of a read operation.

The latch circuit includes two inverter circuits connected in a flip-flop configuration and the two inverter circuits are driven by the first and second internal power supply potentials.

The level shifter includes first and second MOS transistors serially connected and third and fourth MOS transistors serially connected, the gate of the third MOS transistor is connected to a first connection node of the first and second MOS transistors, the gate of the first MOS transistor is connected to a second connection node of the third and fourth MOS transistors, the first connection node acts as the first output terminal and the second connection node acts as the second output terminal.

The latch type level shift circuit of this invention further comprises a logic circuit for determining data held by the latch circuit by selectively setting one of the second and fourth MOS transistors into the ON state.

The latch type level shift circuit is used in the decode circuit of the flash memory and the logic circuit selectively sets one of the second and fourth MOS transistors into the ON state based on an address signal and an operation mode of the flash memory.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

There will now be described a latch type level shift circuit of this invention with reference to the accompanying drawings.

Figure 12:
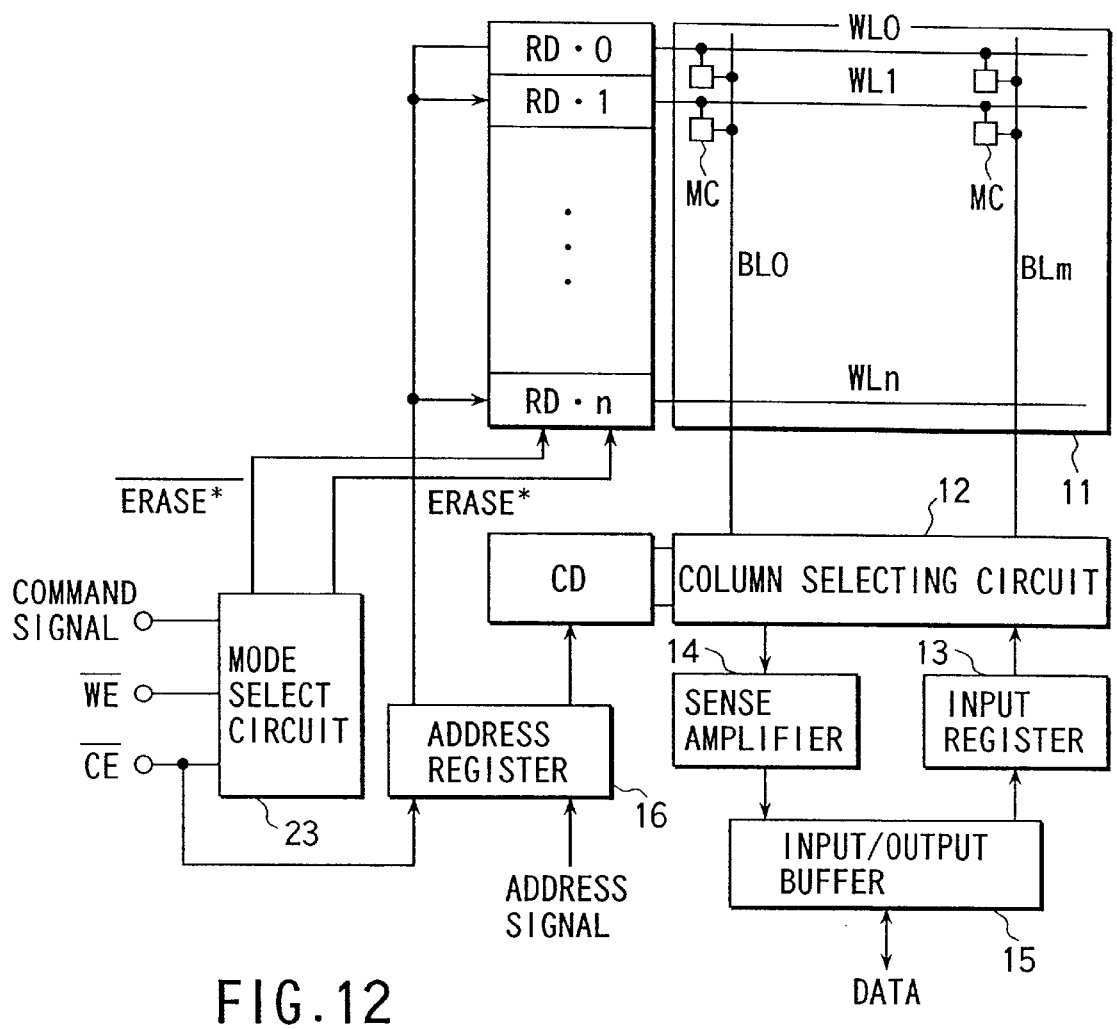
FIG. 12 is a diagram showing the main portion of a flash memory to which the level shift circuit of this invention is applied.

FIG. 12 shows the main portion of a NOR type flash EEPROM to which the latch type level shift circuit of this invention is applied.

A memory cell array 11 includes a plurality of memory cells MC arranged in an array form. A plurality of word lines WL0, WL1, ..., WLn extending in the row direction and a plurality of bit lines BL0, ..., BLm extending in the column direction are arranged on the memory cell array 11.

For example, a plurality of row decode circuits RD•0, RD•1, ..., RD•n are respectively provided for the plurality of word lines WL0, WL1, ..., WLn. One end of the word line WLi (i is 0, 1, ..., n) is connected to a row decode circuit RD•i corresponding thereto.

For example, the latch type level shift circuit of this invention is provided in each of the row decode circuits RD•0, RD•1, ..., RD•n.

A column selecting circuit 12 is connected to the plurality of bit lines BL0, BL1, ..., BLm and selects one of the columns based on an output signal from a column decode circuit CD. The bit line on the selected column is electrically connected to an input register 13 or sense amplifier 14. An input/output buffer 15 is provided to transfer data between the interior and the exterior of the memory chip.

A row address signal is input to the plurality of row decode circuits RD•0, RD•1, ..., RD•n via an address register 16. A column address signal is input to the column decode circuit CD via the address register 16.

Figure 13:
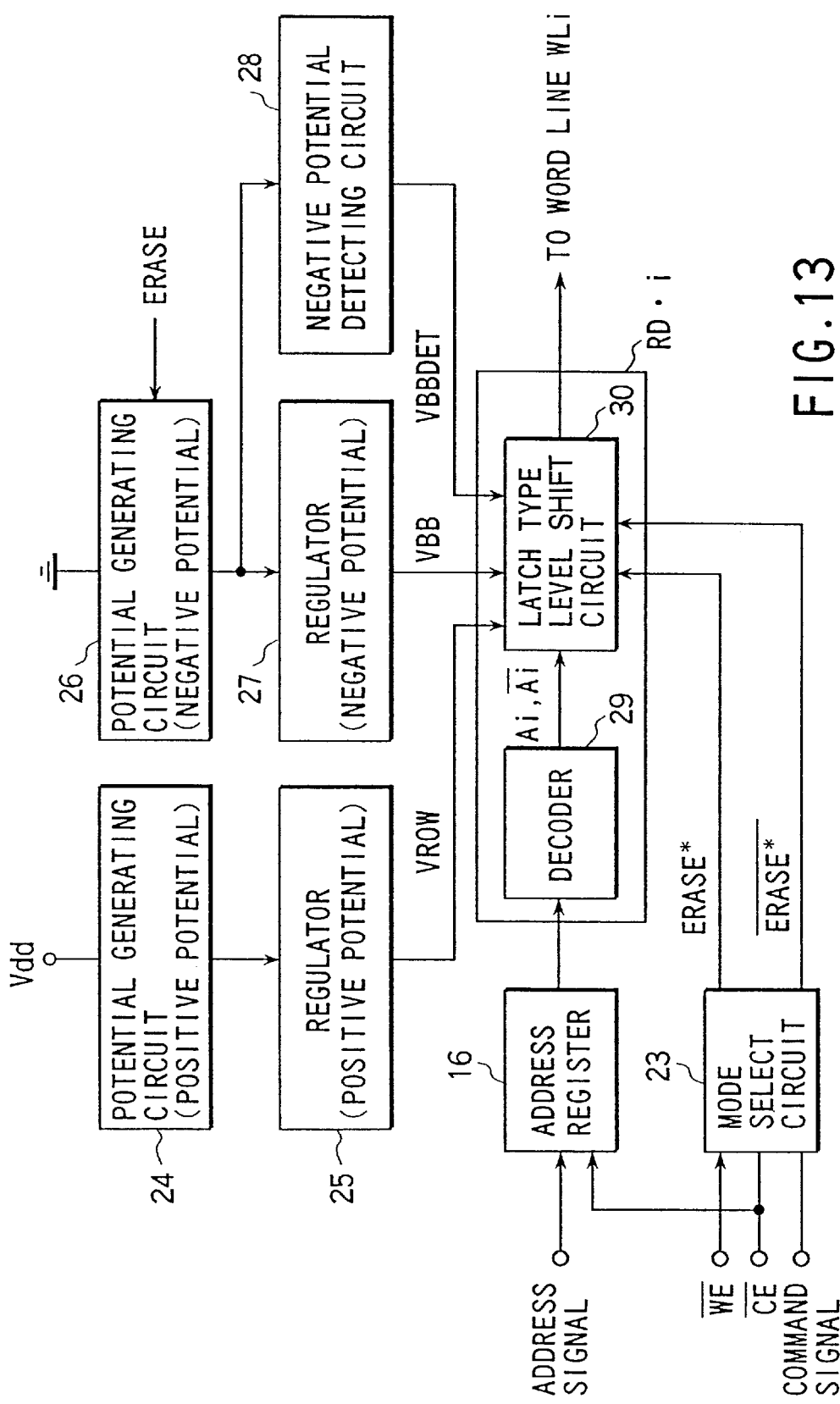
FIG. 13 is a diagram showing a row decoder circuit and a control circuit thereof.

FIG. 13 shows one example of the row decode circuit and a control circuit therefor.

The row decode circuit RD•i includes a row decoder 29 and latch type level shift circuit 30.

The row address signal is input to the row decoder 29 via the address register 16. The row decoder 29 supplies decode signals Ai, $\overline{Ai}$ indicating the result of decoding of the row address signal to the latch type level shift circuit 30. When the row containing the word line WLi is selected, the decode signal Ai is set to "H" and the decode signal $\overline{Ai}$ is set to "L".

A write enable signal $\overline{WE}$, chip enable signal $\overline{CE}$ and command signal are input to a mode select circuit 23. The mode select circuit 23 supplies erase signals ERASE*, $\overline{ERASE*}$ to the latch type level shift circuit 30.

A potential generating circuit (booster or charge pump circuit) 24 outputs VROW (positive potential or ground potential). VROW is supplied to the latch type level shift circuit 30 via a regulator 25. A potential generating circuit (booster or charge pump circuit) 26 outputs VBB (ground potential or negative potential). VBB is supplied to the latch type level shift circuit 30 via a regulator 27.

A negative potential detecting circuit 28 detects the value of VBB, sets VBBDET to "H" when the value of VBB is becomes smaller than a preset value (for example, –4V) and sets VBBDET to "L" when the value of VBB is larger than the preset value.

Figure 1:
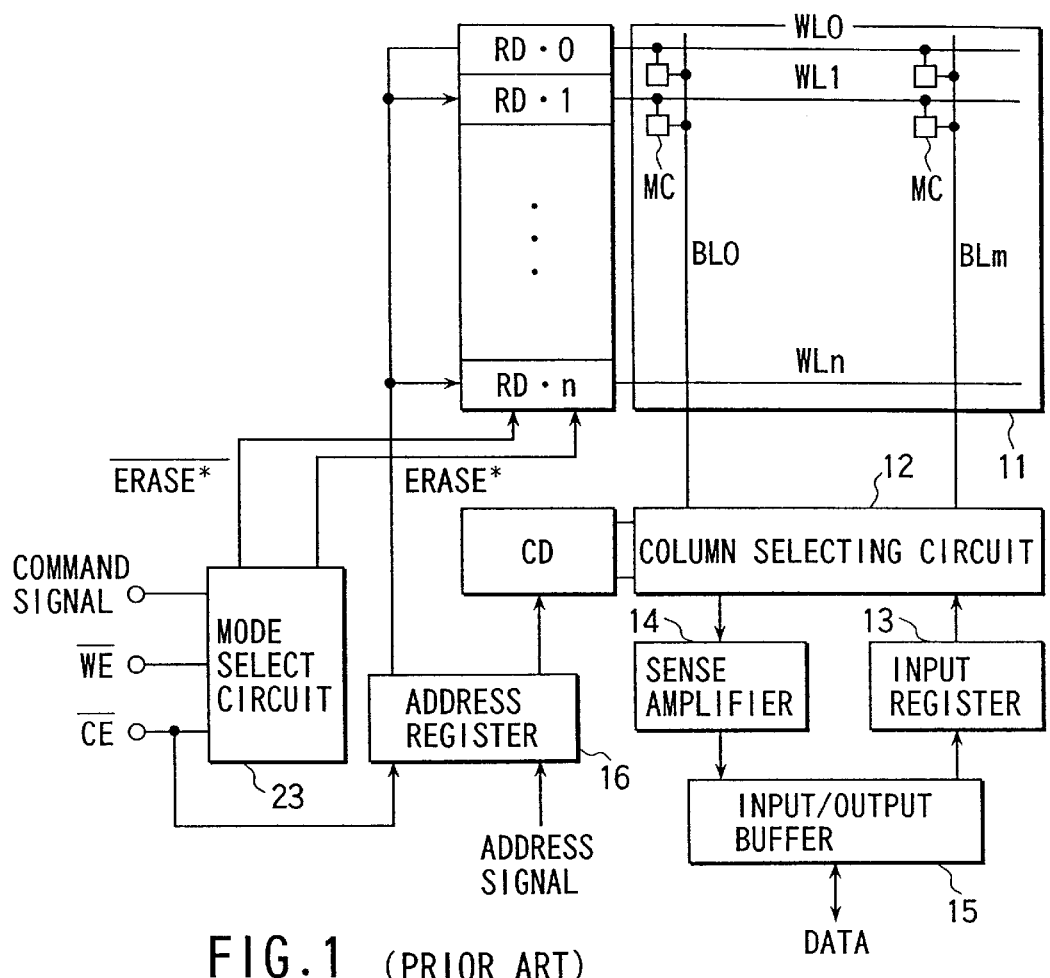
FIG. 1 is a diagram showing the main portion of a NOR type flash EEPROM.
Figure 2:
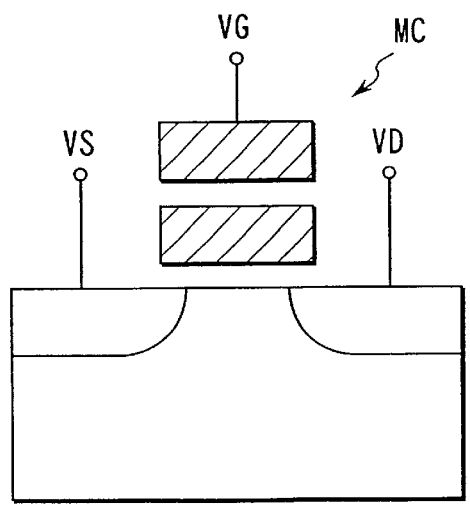
FIG. 2 is a view showing a stacked gate memory cell.
Figure 3:
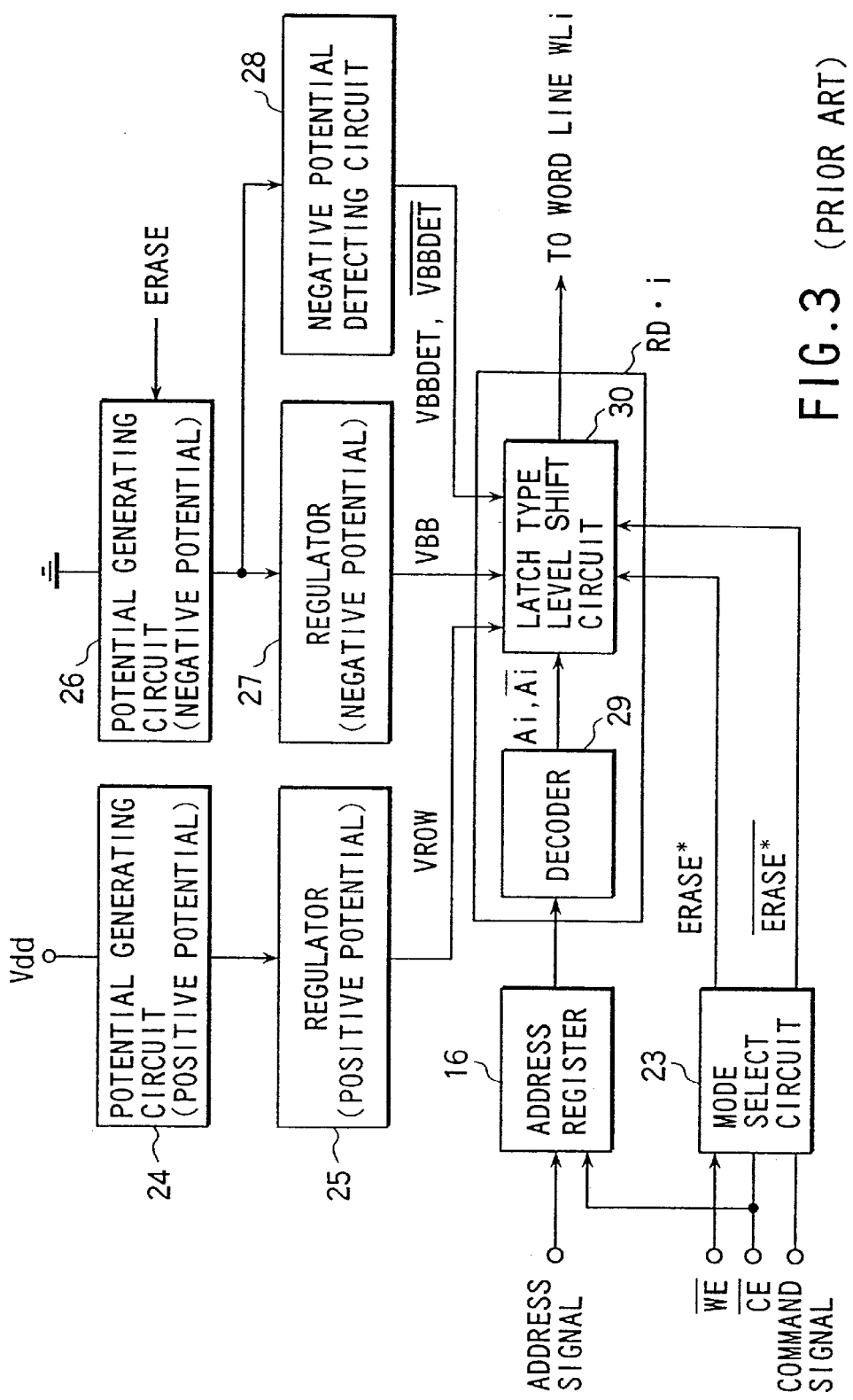
FIG. 3 is a diagram showing a row decoder circuit and a control circuit thereof.
Figure 4:
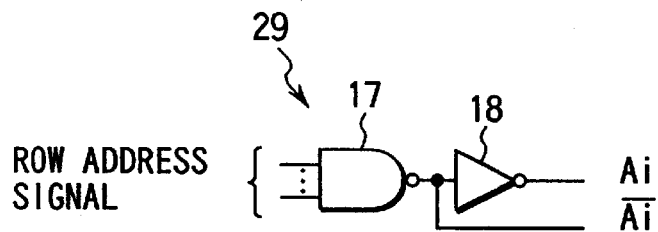
FIG. 4 is a diagram showing a row decoder circuit.
Figure 5:
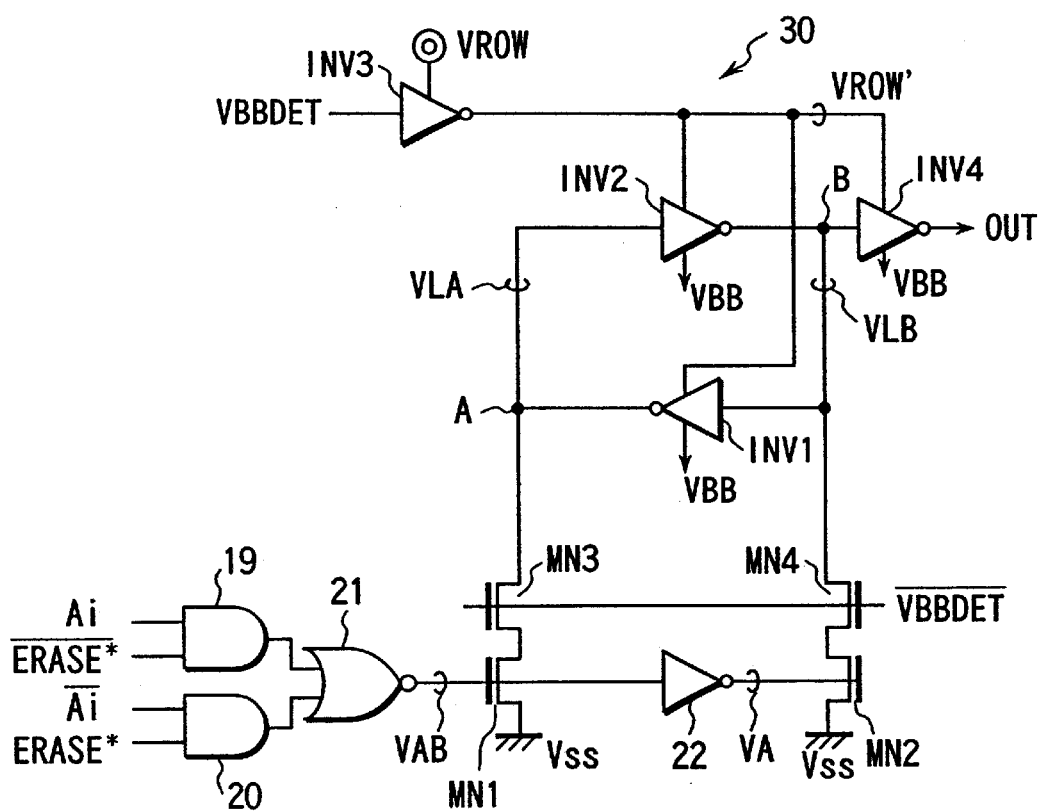
FIG. 5 is a diagram showing a conventional latch type level shift circuit.
Figure 6:
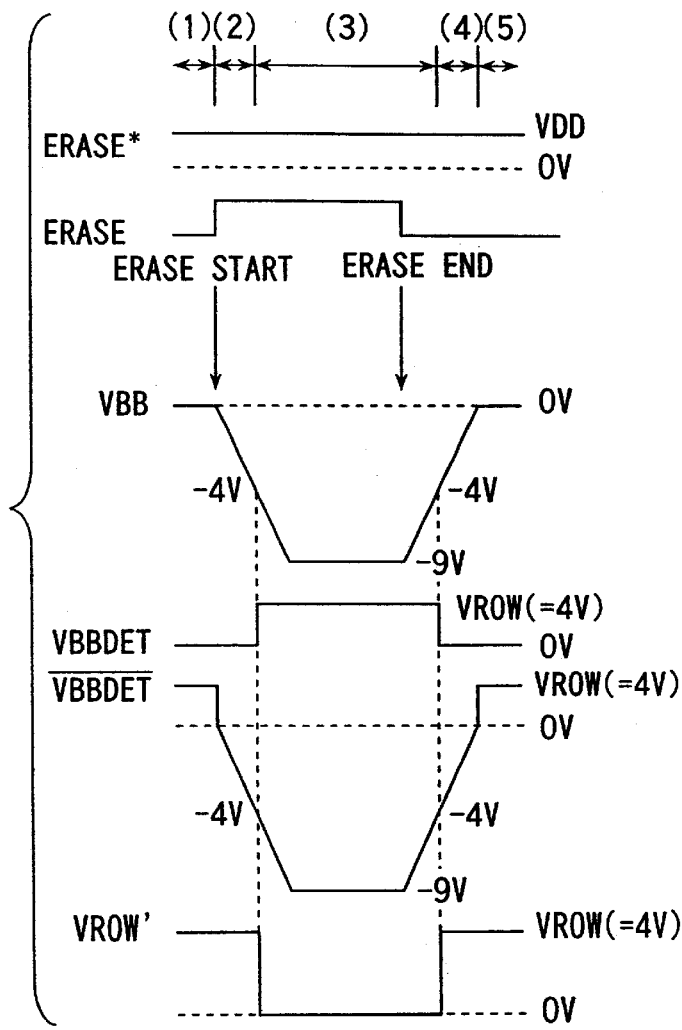
FIG. 6 is a diagram showing signal waveforms at the time of erase operation.

Further, the negative potential detecting circuit 28 of the present example does not require a signal corresponding to $\overline{VBBDET}$ as present in the conventional case illustrated in FIG. 3.

Figure 14:
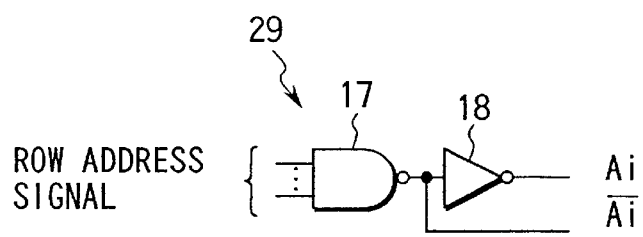
FIG. 14 is a diagram showing the row decoder.

FIG. 14 shows one example of the row decoder.

The row decoder includes a NAND circuit 17 supplied with a row address signal and an inverter circuit 18. The NAND circuit 17 outputs a decode signal $\overline{Ai}$ and the inverter circuit 18 outputs a decode signal Ai.

Figure 15:
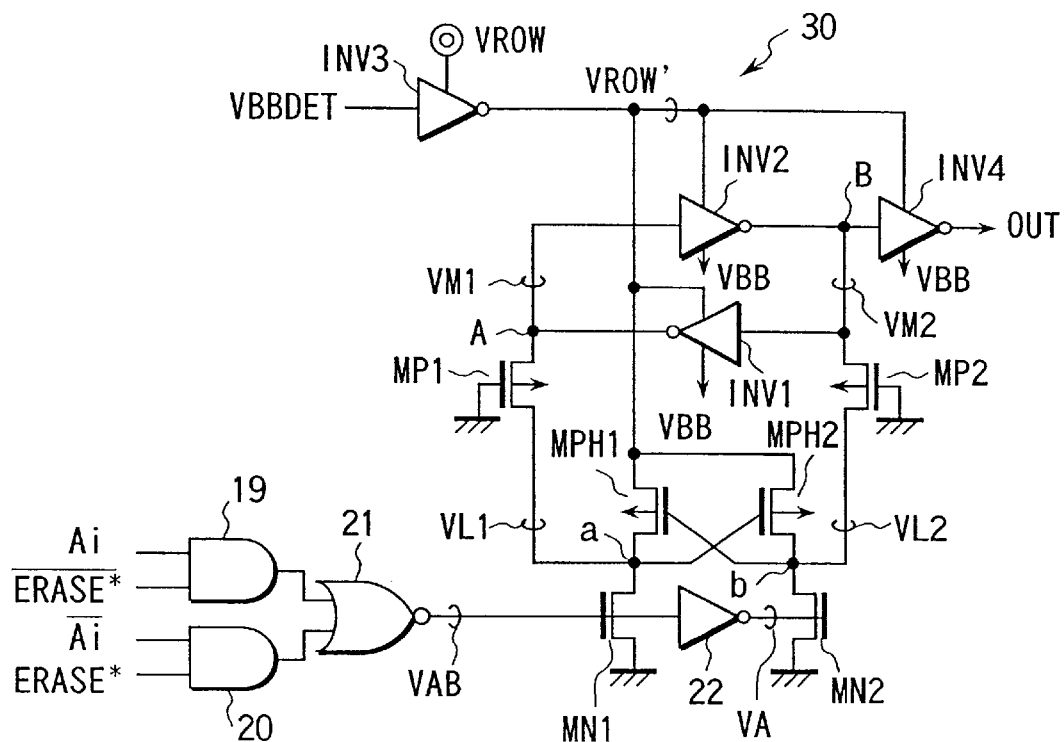
FIG. 15 is a diagram showing a first example of the latch type level shift circuit of this invention.

FIG. 15 shows a first example of the latch type level shift circuit of this invention.

A latch circuit including inverter circuits INV1, INV2 is connected between nodes A and B. The node B is connected to the input terminal of an inverter circuit INV4. An output signal OUT of the inverter circuit INV4 is supplied to the word line WLi. A signal VBBDET is input to an inverter circuit INV3 and an internal power supply potential VROW' is output from the inverter circuit INV3. The internal power supply potentials VROW', VBB are supplied to the inverter circuits INV1, INV2, INV4.

A P-channel MOS transistor MPH1 and an N-channel MOS transistor MN1 are serially connected between the output terminal of the inverter circuit INV3 and a ground node VSS. Further, a P-channel MOS transistor MPH2 and an N-channel MOS transistor MN2 are serially connected between the output terminal of the inverter circuit INV3 and the ground node VSS. The gate of the MOS transistor MPH1 is connected to an output terminal b of the level shifter and the gate of the MOS transistor MPH2 is connected to an output terminal a of the level shifter.

A P-channel MOS transistor MP1 is connected between the node A of the latch circuit and the output terminal a of the level shifter and a P-channel MOS transistor MP2 is connected between the node B of the latch circuit and the output terminal b of the level shifter. The gates of the MOS transistors MP1, MP2 are connected to the ground node VSS.

An output signal VAB of the NOR circuit 21 is input to the gate of the MOS transistor MN1 and a signal VA obtained by inverting the output signal VAB of the NOR circuit 21 by use of an inverter circuit 22 is input to the gate of the MOS transistor MN2. The NOR circuit 21 is supplied with output signals of AND circuits 19, 20. The AND circuit 19 is supplied with a decode signal Ai and erase signal $\overline{ERASE*}$ and the AND circuit 20 is supplied with a decode signal $\overline{Ai}$ and erase signal ERASE*.

The latch type level shift circuit of this invention can be roughly divided into the following five constituents.

(1) A logic circuit (19, 20, 21) for determining data held by the latch circuit based on the operation mode and decode signal.

(2) A level shifter (MPH1, MPH2, MN1, MN2) for converting the level of the output signal of the logic circuit.

(3) A latch circuit (INV1, INV2) for holding the signal whose level is shifted.

(4) An internal power supply potential generating circuit (24 to 28, INV3) for switching "H", "L" levels of data held in the latch circuit.

(5) A cut-off circuit (MP1, MP2) for preventing a leak current from flowing when the "L" level of data of the latch circuit is set to a negative potential.

When the latch type level shift circuit of this invention is compared with the conventional latch type level shift circuit, constituents (2) and (5) are new.

That is, if much attention is paid to constituent (2), a ground potential is applied to one of the two nodes A, B of the latch circuit from the level shifter in the conventional case, and an internal power supply potential VROW' (for example, 4V) is applied to one of the two nodes A, B of the latch circuit from the level shifter in the present example.

Further, if much attention is paid to constituent (5), the N-channel MOS transistor having a gate applied with the control signal VBBDET is connected between the latch circuit and the level shifter in the conventional case, and the P-channel MOS transistor having a gate connected to the ground node VSS is connected between the latch circuit and the level shifter in the present example.

As a result, since the P-channel MOS transistor is cut off even if one of the two nodes A and B of the latch circuit is set to a negative potential, a leak current can be prevented from flowing. Further, since a control signal corresponding to $\overline{\text{VBBDET}}$ of the conventional case is not necessary, the control circuit can be simplified in construction, time for the design can be reduced, the chip area can be reduced and the operation speed can be enhanced by a reduction in the load of the potential generating circuit (booster or charge pump circuit).

Since the level shift circuit of this invention includes a latch circuit, the voltage stress applied to the MOS transistor can be alleviated by adjusting the timing for changing the values of the internal power supply potentials VROW', VBB.

Since the voltage stress applied to the MOS transistor can be alleviated, the size of the MOS transistor can be reduced, thereby contributing to miniaturization of the MOS transistors constructing the level shift circuit of this invention.

For example, according to this invention, when the external power supply voltage Vcc is set to 1.8V or less, the thickness of the gate oxide film of the normal MOS transistor is set to 5.5 nm or less, the threshold voltage thereof is set to approx. 0.5V or less and the withstand voltage thereof is set to 3V or less. Further, the thickness of the gate oxide film of a MOS transistor to which a voltage (for example, 9V at maximum) higher than the external power supply voltage Vcc is applied is set to 14 nm or less and the threshold voltage thereof is set to approx. 0.8V or less.

Of course, the thicknesses of the gate oxide films of all of the MOS transistors may be set to 14 nm or less and the threshold voltages thereof may be set to approx. 0.8V or less so that they can withstand a voltage of 9V at maximum.

Next, the operation of the latch type level shift circuit of this invention is explained.

First, the meanings of signals appearing in FIGS. 13 to 15 are explained.

ERASE* is a signal indicating whether the memory circuit in the chip is set in the erase mode or not. In the present example, when ERASE* is set at "H", the erase mode is set and when ERASE* is set at "L", a mode other than the erase mode is set. ERASE is a signal indicating whether a negative potential is applied to the selected word line WLi or not. When ERASE is set at "H", a negative potential is applied to the selected word line WLi and when ERASE is set at "L", a voltage equal to or higher than 0V is applied to the selected word line WLi.

VBB is an internal power supply potential output from the potential generating circuit (booster or charge pump circuit) and is set to the ground potential or negative potential. VBBDET is a negative potential detecting signal indicating whether or not VBB is set to a negative potential lower than a preset potential. For example, VBBDET is set to "H" when VBB is lower than an intermediate potential (for example, −4V) between the ground potential (0V) and a negative high potential (for example, −9V) necessary for erase and is set to "L" when VBB is higher than the intermediate potential.

VROW' is an internal power supply potential and, for example, it is set to the ground potential (0V) when VBB is lower than an intermediate potential between the ground potential and a negative high potential necessary for erase and is set to VROW (for example, 4V) when VBB is higher than the intermediate potential.

Program Operation (Pre-Program Operation)

First, ERASE* is set to "L", $\overline{\text{ERASE*}}$ is set to "H", VROW is set to 9V and VBB is set to 0V. Since VBB=0V, the negative potential detecting circuit outputs VBBDET= "L".

Since all of the row address signals in the row decoder RD•i of the selected row are set to "H", Ai is set to "H" and $\overline{\text{Ai}}$ is set to "L". At this time, the output signal VAB of the NOR circuit 21 is set to "L" and the output signal VA of the inverter circuit 22 is set to "H". As a result, the MOS transistor MN1 is set into the OFF state and the MOS transistor MN2 is set into the ON state.

At this time, VL2 is set to the ground potential (0V) and the MOS transistor MPH1 is set into the ON state. Further, since the MOS transistor MPH1 is set into the ON state, VL1 is set equal to VROW' (=VROW=9V) and the MOS transistor MPH2 is set into the OFF state.

Since the gate of the MOS transistor MP2 is set at the ground potential (0V) and VL2 is also set at the ground potential, it maintains the OFF state in principle. However, when the potential VM2 of the node B of the latch circuit is higher than the ground potential (0V) by an amount larger than the threshold voltage Vthp of the MOS transistor MP2, the MOS transistor MP2 is set into the ON state. In this case, both of VM2 and VL2 are set to the ground potential because the MOS transistor MN2 is set in the ON state.

Since the gate of the MOS transistor MP1 is set at the ground potential (0V) and VL1 is set at VROW' (=VROW =9V), it is set into the ON state. At this time, the potential VM1 of the node A of the latch circuit is charged to VROW' (=VROW =9V). Therefore, in the latch circuit, "H (=9V)" is stably held in the node A and "L (=0V)" is stably held in the node B.

Further, since the node B is set at "L (=VBB=0V)", the output signal OUT of the inverter circuit INV4 is set to "H (=VROW'=9V)".

Then, a potential of "H (=9V)" is applied to the selected word line for a preset period of time and electrons are injected into the floating gate electrode of the selected memory cell.

Since all of the row address signals are not set to "H" in the row decoder of the non-selected row, Ai is set to "L" and $\overline{\text{Ai}}$ is set to "H". At this time, the output signal VAB of the NOR circuit 21 is set to "H" and the output signal VA of the inverter circuit 22 is set to "L". As a result, the MOS transistor MN1 is set into the ON state and the MOS transistor MN2 is set into the OFF state.

At this time, VL1 is set to the ground potential (0V) and the MOS transistor MPH2 is set into the ON state. Further, since the MOS transistor MPH2 is set into the ON state, VL2 is set equal to VROW' (=VROW=9V) and the MOS transistor MPH1 is set into the OFF state.

Since the gate of the MOS transistor MP1 is set at the ground potential (0V) and VL1 is also set at the ground potential, it maintains the OFF state in principle. However, when the potential VM1 of the node A of the latch circuit is higher than the ground potential (0V) by an amount larger than the threshold voltage Vthp of the MOS transistor MP1, the MOS transistor MP1 is set into the ON state. In this case, both of VM1 and VL1 are set to the ground potential because the MOS transistor MN1 is set in the ON state.

Since the gate of the MOS transistor MP2 is set at the ground potential (0V) and VL2 is set at VROW' (=VROW =9V), it is set into the ON state. At this time, the potential VM2 of the node B of the latch circuit is charged to VROW' (=VROW =9V). Therefore, in the latch circuit, "L (=0V)" is stably held in the node A and "H (=9V)" is stably held in the node B.

Further, since the node B is set at "H (=VROW'=9V)", the output signal OUT of the inverter circuit INV4 is set to "L (=VBB=0V)".

Erase Operation

The erase operation is explained with reference to signal waveforms of FIG. 16.

First, in the initial state (period 1)), ERASE* is set at "H", $\overline{\text{ERASE}}$* is set at "L", VROW is set at 4V and VBB is set at 0V. Since VBB=0V, the negative potential detecting circuit 28 outputs VBBDET="L(0V)".

Since all of the row address signals in the row decoder of the selected row are set to "H", Ai is set to "H" and $\overline{\text{Ai}}$ is set to "L". At this time, the output signal VAB of the NOR circuit 21 is set to "H" and the output signal VA of the inverter circuit 22 is set to "L". As a result, the MOS transistor MN1 is set into the ON state and the MOS transistor MN2 is set into the OFF state.

At this time, VL1 is set to the ground potential (0V) and the MOS transistor MPH2 is set into the ON state. Further, since the MOS transistor MPH2 is set into the ON state, VL2 is set equal to VROW' (=VROW =4V) and the MOS transistor MPH1 is set into the OFF state.

Since the gate of the MOS transistor MP1 is set at the ground potential (0V) and VL1 is also set at the ground potential, it maintains the OFF state in principle. However, when the potential VM1 of the node A of the latch circuit is higher than the ground potential (0V) by an amount larger than the threshold voltage Vthp of the MOS transistor MP1, the MOS transistor MP1 is set into the ON state. In this case, both of VM1 and VL1 are set to the ground potential because the MOS transistor MN1 is set in the ON state.

Since the gate of the MOS transistor MP2 is set at the ground potential (0V) and VL2 is set at VROW' (=VROW= 4V), it is set into the ON state. At this time, the potential VM2 of the node B of the latch circuit is charged to VROW' (=VROW=4V). Therefore, in the latch circuit, "L (=0V)" is stably held in the node A and "H (=4V)" is stably held in the node B.

Further, since the node B is set at "H (=VROW'=4V)", the output signal OUT of the inverter circuit INV4 is set to "L (=VBB=0V)".

Since all of the row address signals are not set to "H" in the row decoder of the non-selected row, Ai is set to "L" and $\overline{\text{Ai}}$ is set to "H". At this time, the output signal VAB of the NOR circuit 21 is set to "L" and the output signal VA of the inverter circuit 22 is set to "H". As a result, the MOS transistor MN1 is set into the OFF state and the MOS transistor MN2 is set into the ON state.

At this time, VL2 is set to the ground potential (0V) and the MOS transistor MPH1 is set into the ON state. Further, since the MOS transistor MPH1 is set into the ON state, VL1 is set equal to VROW' (=VROW=4V) and the MOS transistor MPH2 is set into the OFF state.

Since the gate of the MOS transistor MP2 is set at the ground potential (0V) and VL2 is also set at the ground potential, it maintains the OFF state in principle. However, when the potential VM2 of the node B of the latch circuit is higher than the ground potential (0V) by an amount larger than the threshold voltage Vthp of the MOS transistor MP2, the MOS transistor MP2 is set into the ON state. In this case, both of VM2 and VL2 are set to the ground potential because the MOS transistor MN2 is set in the ON state.

Since the gate of the MOS transistor MP1 is set at the ground potential (0V) and VL1 is set at VROW' (=VROW= 4V), it is set into the ON state. At this time, the potential VM1 of the node A of the latch circuit is charged to VROW' (=VROW=4V). Therefore, in the latch circuit, "H (=4V)" is stably held in the node A and "L (=0V)" is stably held in the node B.

Further, since the node B is set at "L (=VBB=0V)", the output signal OUT of the inverter circuit INV4 is set to "H (=VROW'=4V)".

After this, if ERASE is changed from "L" to "H", the potential generating circuit (booster or charge pump circuit) 26 gradually lowers VBB from 0V towards −9V (period (2)).

At this time, in the conventional case, a leak current flows from the ground node VSS towards the VBB terminal and a complicated control method for preventing the leak current flow is required.

In the present example, even when the potential VL1 of the output terminal a of the level shifter is set to the ground potential and the potential VM1 of the node A of the latch circuit is set to VBB (negative potential) in the selected row, the MOS transistor MP1 maintains the OFF state since the gate of the MOS transistor MP1 is grounded. Therefore, no leak current flows from the ground node VSS towards the VBB terminal.

Likewise, even when the potential VL2 of the output terminal b of the level shifter is set to the ground potential and the potential VM2 of the node B of the latch circuit is set to VBB (negative potential) in the non-selected row, the MOS transistor MP2 maintains the OFF state since the gate of the MOS transistor MP2 is grounded. Therefore, no leak current flows from the ground node VSS towards the VBB terminal.

Further, in the present example, the leak current can be prevented simply by connecting the P-channel MOS transistors MP1, MP2 whose gates are grounded between the level shifter and the latch circuit. Therefore, the control signal (corresponding to $\overline{\text{VBBDET}}$ in the conventional case) for preventing the leak current becomes unnecessary and time for the design can be shortened and the chip area can be reduced by simplifying the construction of the control circuit.

Also, in the present example, since the control signal corresponding to $\overline{\text{VBBDET}}$ in the conventional case becomes unnecessary, the load of the potential generating circuit (booster or charge pump circuit) can be alleviated. Therefore, the speed of the erase operation can be enhanced.

In the period (3), that is, when VBB becomes lower than −4V, the negative potential detecting circuit 28 changes VBBDET from "L" to "H". At this time, VROW (=VROW') is changed from 4V to 0V. That is, the "H" levels of the inverter circuits INV1, INV2, INV4 are set to 0V and the "L" levels thereof are set to VBB.

Since the power supply voltage of the level shifter (MN1, MN2, MPH1, MPH2) is set to 0V if VROW is set to 0V, the values of the outputs VL1, VL2 thereof become indefinite.

For example, since the MOS transistor MN2 is set in the OFF state in the selected row, the value of VL2 becomes indefinite if the MOS transistor MPH2 is set into the OFF state. However, since the potential VM2 of the node B of the latch circuit is set to "H (=0V)" if VROW is set to 0V, data of the latch circuit will not become indefinite. VL1 keeps the ground potential and does not become indefinite since the MOS transistor MN1 is set in the ON state.

Likewise, since the MOS transistor MN1 is set in the OFF state in the non-selected row, the value of VL1 becomes indefinite if the MOS transistor MPH1 is set into the OFF state. However, since the potential VM1 of the node A of the latch circuit is set to "H (=0V)" if VROW is set to 0V, data of the latch circuit will not become indefinite. VL2 keeps the ground potential and does not become indefinite since the MOS transistor MN2 is set in the ON state.

The technique for preventing the outputs VL1, VL2 of the level shifter (MN1, MN2, MPH1, MPH2) from becoming indefinite when VROW is set to 0V is explained later.

The reason why the values of VBBDET and VROW are changed with VBB of −4V set as a boundary is to prevent the maximum value of the voltage stress applied to the inverter circuits INV1, INV2, INV4 from exceeding 9V. That is, the voltage stress at the changeover point is set to VROW (=4V)−VBB (=−4V)=8V.

After this, if VBB becomes −9v, a potential of "L(=−9V)" is applied to the selected word line. If the potential is kept applied to the selected word line for a preset period of time, electrons in the floating gate electrode of the selected memory cell are discharged into the substrate or source.

At this time, a voltage applied to the inverter circuits INV1, INV2, INV4 is set to VROW (=0V)−VBB(=−9V)= 9V. The voltage is the same as the voltage applied to the inverter circuits INV1, INV2, INV4 at the program time.

When ERASE is set to "L", the erase operation is terminated and the potential generating circuit (booster or charge pump circuit) 26 raises VBB from −9V to the ground potential (0V).

In the period (4), that is, when VBB exceeds −4V, the negative potential detecting circuit 28 changes VBBDET from "H" to "L". At this time, VROW (=VROW') is returned to 4V from 0V.

Figure 7:
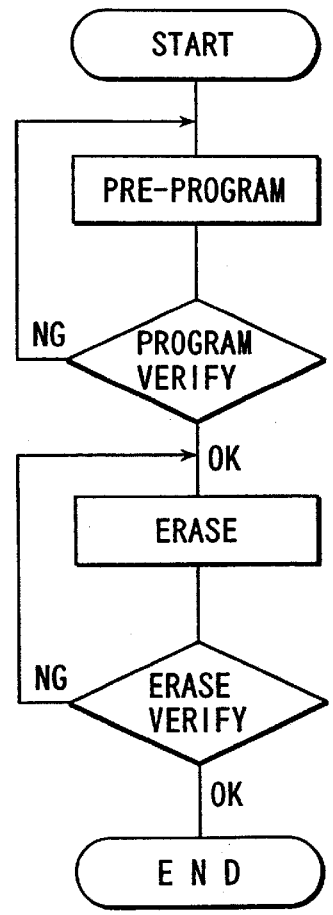
FIG. 7 is a flowchart showing an erase operation sequence.
Figure 8:
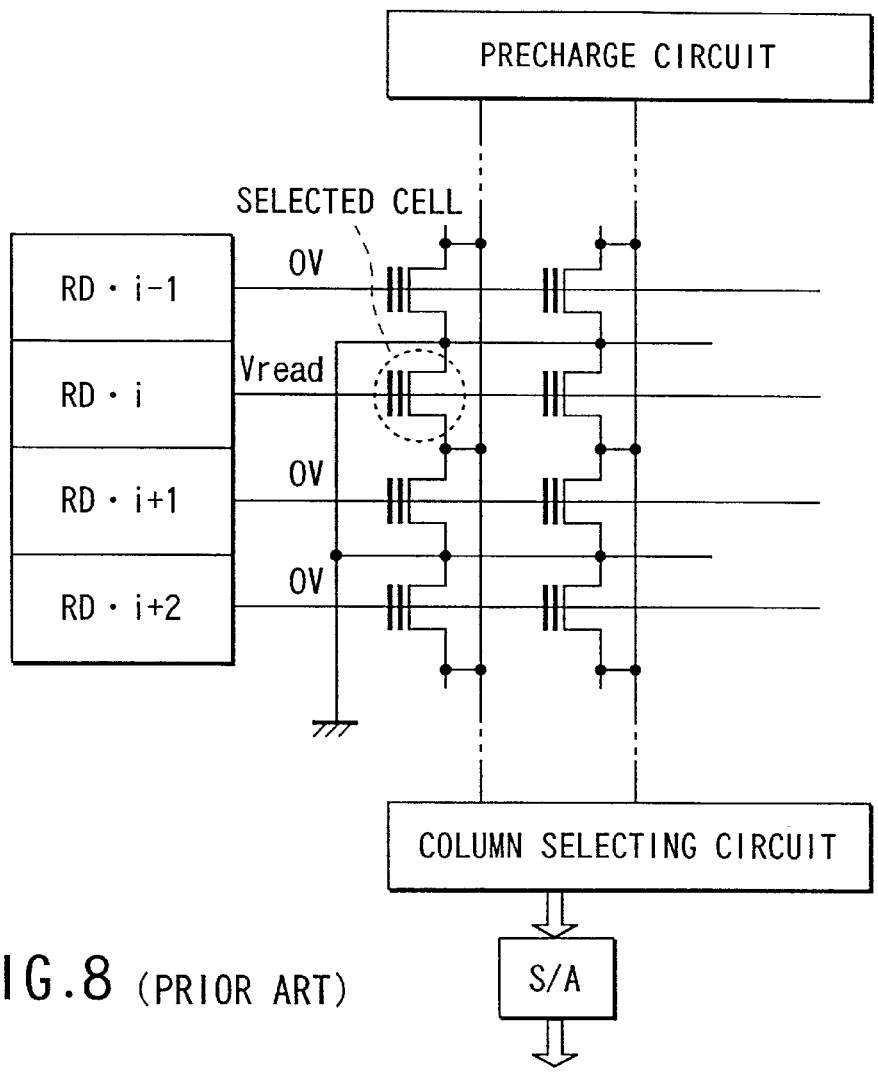
FIG. 8 is a diagram showing potentials applied to word lines at the read time (at the verify read time)
Figure 9:
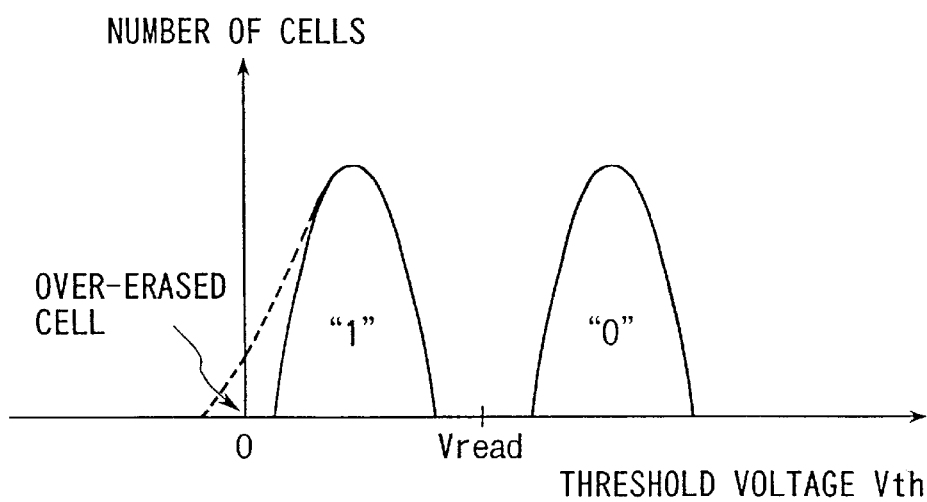
FIG. 9 is a diagram showing the relation between the state (threshold voltage) of a memory cell and the number of cells.
Figure 10:
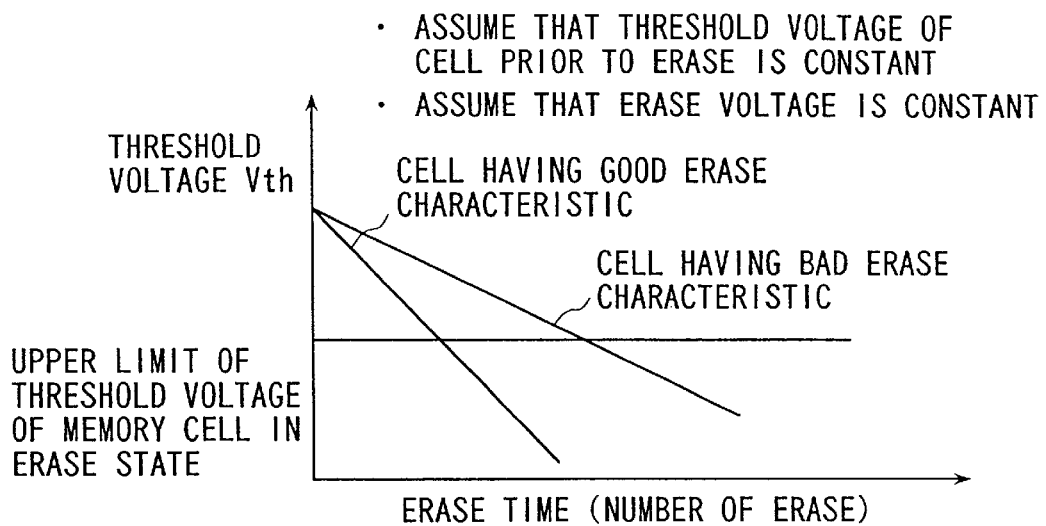
FIG. 10 is a diagram showing the erase characteristic of the memory cell.
Figure 11:
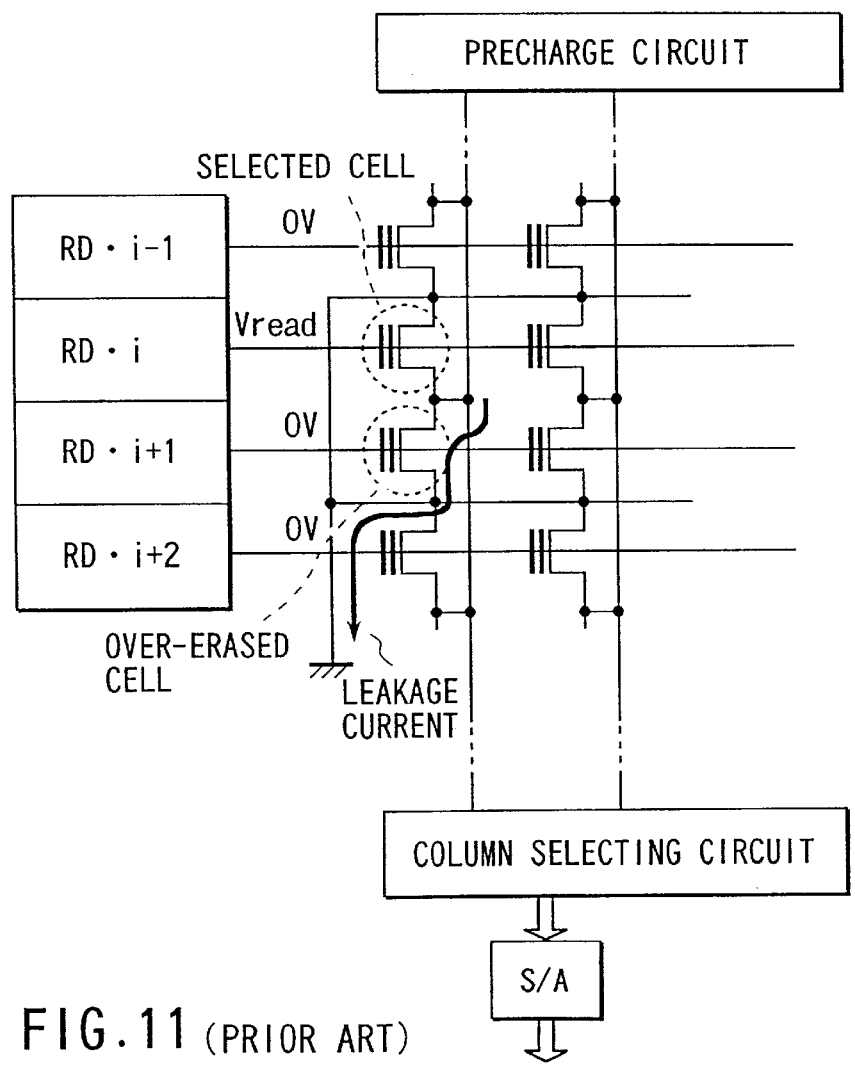
FIG. 11 is a diagram showing a leak path occurring at the read time (verify read time)

The state set when VBB is set to 0V (period (5)) is the same as the initial state (the state of the period (1)) and the above-described erase operation is repeatedly effected according to the sequence of FIG. 7, for example, until the erase operation for all of the memory cells is completed.

Verify Operation (Read Operation)

Figure 17:
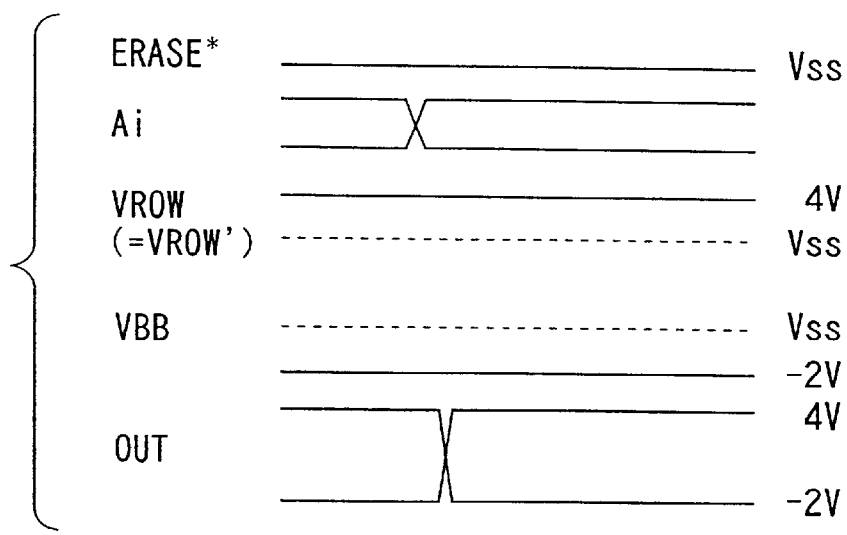
FIG. 17 is a diagram showing signal waveforms at the erase verify time.

The verify operation can be expressed by signal waveforms of FIG. 17.

First, ERASE* is set to "L", $\overline{\text{ERASE*}}$ is set to "H", VROW is set to 4V and VBB is set to −2V. Since VBB=−2V, the negative potential detecting circuit outputs VBBDET= "L".

Since all of the row address signals in the row decoder RD•i of the selected row are set to "H", Ai is set to "H" and $\overline{\text{Ai}}$ is set to "L". At this time, the output signal VAB of the NOR circuit 21 is set to "L" and the output signal VA of the inverter circuit 22 is set to "H". As a result, the MOS transistor MN1 is set into the OFF state and the MOS transistor MN2 is set into the ON state.

At this time, VL2 is set to the ground potential (0V) and the MOS transistor MPH1 is set into the ON state. Further, since the MOS transistor MPH1 is set into the ON state, VL1 is set equal to VROW' (=VROW=4V) and the MOS transistor MPH2 is set into the OFF state.

Since the gate of the MOS transistor MP2 is set at the ground potential (0V) and VL2 is also set at the ground potential, it is set in the OFF state. Since the gate of the MOS transistor MP1 is set at the ground potential (0V) and VL1 is set at VROW' (=VROW=4V), it is set into the ON state. At this time, the potential VM1 of the node A of the latch circuit is charged to VROW' (=VROW=4V). Therefore, in the latch circuit, "H (=4V)" is stably held in the node A and "L (=−2V)" is stably held in the node B.

Further, since the node B is set at "L (=VBB=−2V)", the output signal OUT of the inverter circuit INV4 is set to "H (=VROW'=4V)". The potential is applied to the selected word line and the read operation for data of the selected memory cell is effected.

Since all of the row address signals are not set to "H" in the row decoder of the non-selected row, Ai is set to "L" and $\overline{\text{Ai}}$ is set to "H". At this time, the output signal VAB of the NOR circuit 21 is set to "H" and the output signal VA of the inverter circuit 22 is set to "L". As a result, the MOS transistor MN1 is set into the ON state and the MOS transistor MN2 is set into the OFF state.

At this time, VL1 is set to the ground potential (0V) and the MOS transistor MPH2 is set into the ON state. Further, since the MOS transistor MPH2 is set into the ON state, VL2 is set equal to VROW' (=VROW=4V) and the MOS transistor MPH1 is set into the OFF state.

Since the gate of the MOS transistor MP1 is set at the ground potential (0V) and VL1 is also set at the ground potential, it is set into the OFF state. Since the gate of the MOS transistor MP2 is set at the ground potential (0V) and VL2 is set at VROW' (=VROW=4V), it is set into the ON state. At this time, the potential VM2 of the node B of the latch circuit is charged to VROW' (=VROW=4V). Therefore, in the latch circuit, "L (=−2V)" is stably held in the node A and "H (=4V)" is stably held in the node B.

Further, since the node B is set at "H (=VROW'=4V)", the output signal OUT of the inverter circuit INV4 is set to "L (=VBB=−2V)".

As described above, the level shift circuit of this invention can alleviate the voltage stress applied to the MOS transistor by using the latch circuit and, for example, it can be applied to a decode circuit of a flash EEPROM in which high-speed random access is required. In the flash EEPROM, a positive high potential and a negative high potential are necessary at the program or erase time, but enhancement of the performance and a reduction in the film thickness of the gate oxide film of the MOS transistor can be attained by alleviating the voltage stress applied to the MOS transistor. Further, the MOS transistor can be miniaturized, the area of the decode circuit can be reduced and the cost thereof can be lowered.

Further, in this invention, the P-channel MOS transistor whose gate is grounded is connected between the level shifter and the latch circuit. In this case, flow of a leak current can be prevented since the MOS transistor is set in the OFF state even if the node of the latch circuit is set to a negative potential and the output terminal of the level shifter is set to the ground potential.

Since the control signal (corresponding to $\overline{\text{VBBDET}}$ in the conventional case) for preventing flow of the leak current is unnecessary, the control circuit can be simplified in construction, thereby making it possible to shorten a period of time for the design and shorten the erase time. Further, in the present example, since the control signal such as $\overline{\text{VBBDET}}$ of the conventional case is unnecessary, the load of the potential generating circuit (booster or charge pump circuit) can be alleviated and the speed of the erase operation can be enhanced.

Figure 18:
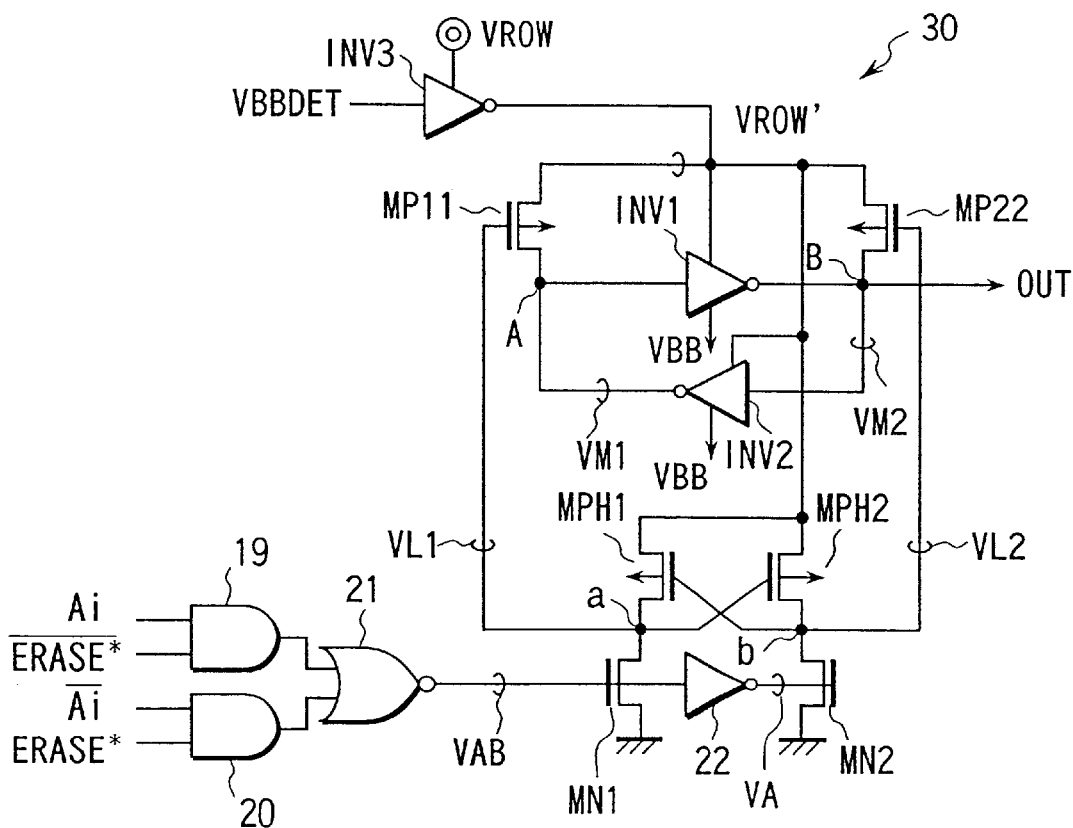
FIG. 18 is a diagram showing a second example of the latch type level shift circuit of this invention.

FIG. 18 shows a second example of the latch type level shift circuit of this invention.

A latch circuit including inverter circuits INV1, INV2 is connected between nodes A and B. The node B is connected to a word line WLi. A signal VBBDET is input to an inverter circuit INV3 and an internal power supply potential VROW' is output from the inverter circuit INV3. The internal power supply potentials VROW', VBB are supplied to the inverter circuits INV1, INV2.

An N-channel MOS transistor MN1 and P-channel MOS transistor MPH1 are serially connected between the output terminal of the inverter circuit INV3 and a ground node VSS. Further, an N-channel MOS transistor MN2 and P-channel MOS transistor MPH2 are serially connected between the output terminal of the inverter circuit INV3 and the ground node VSS. The gate of the MOS transistor MPH1 is connected to an output terminal b of a level shifter and the gate of the MOS transistor MPH2 is connected to an output terminal a of the level shifter.

A P-channel MOS transistor MP11 is connected between the node A and the output terminal of the inverter circuit INV3 and a P-channel MOS transistor MP22 is connected between the node B and the output terminal of the inverter circuit INV3. The gate of the MOS transistor MP11 is connected to the output terminal a of the level shifter and the gate of the MOS transistor MP22 is connected to the output terminal b of the level shifter.

An output signal VAB of a NOR circuit 21 is input to the gate of the MOS transistor MN1 and a signal VA obtained by inverting the output signal VAB of the NOR circuit 21 by use of an inverter circuit 22 is input to the gate of the MOS transistor MN2. Output signals of AND circuits 19, 20 are input to the NOR circuit 21. A decode signal Ai and erase signal $\overline{\text{ERASE}}$* are input to the AND circuit 19 and a decode signal $\overline{\text{Ai}}$ and erase signal ERASE* are input to the AND circuit 20.

The latch type level shift circuit of this invention can be roughly divided into the following five constituents.

(1) A logic circuit (19, 20, 21) for determining data held by the latch circuit based on the operation mode and decode signal.

(2) A level shifter (MPH1, MPH2, MN1, MN2) for converting the level of the output signal of the logic circuit.

(3) A latch circuit (INV1, INV2) for holding the signal whose level is shifted.

(4) An internal power supply potential generating circuit (24 to 28, INV3) for switching "H", "L" levels of data held in the latch circuit.

(5) A cut-off circuit (MP11, MP22) for preventing a leak current from flowing when the "L" level of data of the latch circuit is set to a negative potential.

When the latch type level shift circuit of this invention is compared with the latch type level shift circuit of FIG. 15, constituent (5) is new.

That is, in the example of FIG. 15, the output signal of the level shifter is directly applied to the latch circuit via the P-channel MOS transistors MP1, MP2 whose gates are always grounded and, in the present example, the output signal of the level shifter is input to the gates of the P-channel MOS transistors MP11, MP22 and data to be held in the latch circuit is determined by ON/OFF of the MOS transistors MP11, MP22.

With the above construction, the leak current caused when one of the nodes A and B of the latch circuit is set to a negative potential can be prevented. Further, in the present example, since the output signal of the level shifter is input to the gates of the P-channel MOS transistors MP11, MP22, a control signal corresponding to $\overline{\text{VBBDET}}$ of the conventional case becomes unnecessary, thereby making it possible to simplify the control circuit and alleviate the load of the potential generating circuit (booster or charge pump circuit).

Next, the operation of the latch type level shift circuit of this invention is explained.

Figure 16:
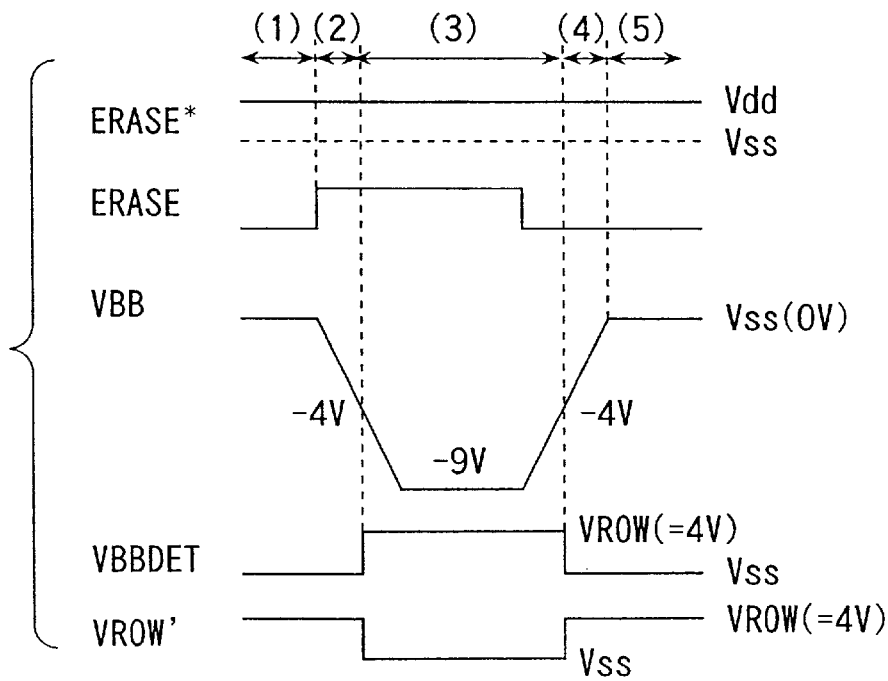
FIG. 16 is a diagram showing signal waveforms at the time of erase operation.

First, the meanings of signals appearing in FIGS. 13, 16 and 18 are explained.

ERASE* is a signal indicating whether the memory circuit in the chip is set in the erase mode or not. In the present example, when ERASE* is set at "H", the erase mode is set and when ERASE* is set at "L", a mode other than the erase mode is set. ERASE is a signal indicating whether a negative potential is applied to the selected word line WLi or not. When ERASE is set at "H", a negative potential is applied to the selected word line WLi and when ERASE is set at "L", a potential equal to or higher than 0V is applied to the selected word line WLi.

VBB is an internal power supply potential output from the potential generating circuit (booster or charge pump circuit) and is set to the ground potential or negative potential. VBBDET is a negative potential detecting signal indicating whether or not VBB is set to a potential lower than a preset potential. For example, VBBDET is set to "H" when VBB is lower than an intermediate potential (for example, –4V) between the ground potential (0V) and a negative high potential (for example, –9V) necessary for erase and is set to "L" when VBB is higher than the intermediate potential.

VROW' is an internal power supply potential and, for example, it is set to the ground potential (0V) when VBB is lower than an intermediate potential (–4V) between the ground potential (0V) and a negative high potential (–9V) necessary for erase and is set to VROW (4V) when VBB is higher than the intermediate potential.

Program Operation (Pre-Program Operation)

First, ERASE* is set to "L", $\overline{\text{ERASE}}$* is set to "H", VROW is set to 9V and VBB is set to 0V. Since VBB=0V, the negative potential detecting circuit outputs VBBDET= "L".

Since all of the row address signals in the row decoder RD•i of the selected row are set to "H", Ai is set to "H" and $\overline{\text{Ai}}$ is set to "L". At this time, the output signal VAB of the NOR circuit 21 is set to "L" and the output signal VA of the inverter circuit 22 is set to "H". As a result, the MOS transistor MN1 is set into the OFF state and the MOS transistor MN2 is set into the ON state.

At this time, VL2 is set to the ground potential (0V) and the MOS transistor MPH1 is set into the ON state. Further, since the MOS transistor MPH1 is set into the ON state, VL1 is set equal to VROW' (=VROW=9V) and the MOS transistor MPH2 is set into the OFF state.

Since the ground potential (0V) is input to the gate of the MOS transistor MP22, the MOS transistor MP22 is set into the ON state. Therefore, the potential VM2 of the node B of the latch circuit is charged to VROW' (=9V). Further, since VROW' is input to the gate of the MOS transistor MP11, the MOS transistor MP11 is set into the OFF state.

Therefore, in the latch circuit, VM1="L (=VBB=0V)" and VM2="H (=VROW'=9V)" are stably held. Then, a potential of "H (=9V)" is applied to the word line of the selected row for a preset period of time and electrons are injected into the floating gate electrode of the selected memory cell.

Since all of the row address signals are not set to "H" in the row decoder of the non-selected row, Ai is set to "L" and $\overline{\text{Ai}}$ is set to "H". At this time, the output signal VAB of the NOR circuit 21 is set to "H" and the output signal VA of the inverter circuit 22 is set to "L". As a result, the MOS transistor MN1 is set into the ON state and the MOS transistor MN2 is set into the OFF state.

At this time, VL1 is set to the ground potential (0V) and the MOS transistor MPH2 is set into the ON state. Further, since the MOS transistor MPH2 is set into the ON state, VL2 is set equal to VROW' (=VROW=9V) and the MOS transistor MPH1 is set into the OFF state.

Since the ground potential (0V) is input to the gate of the MOS transistor MP11, the MOS transistor MP11 is set into the ON state. Therefore, the potential VM1 of the node A of the latch circuit is charged to VROW' (=9V). Further, since VROW' is input to the gate of the MOS transistor MP22, the MOS transistor MP22 is set into the OFF state.

Therefore, in the latch circuit, VM1="H (=VROW'=9V)" and VM2="L (=VBB=0V)" are stably held. Then, a potential of "L (=0V)" is applied to the word line of the selected row for a preset period of time and the selected memory cell maintains the erase state.

Erase Operation

The signal waveforms of FIG. 16 can be applied to the explanation of the erase operation and the erase operation is explained with reference to the signal waveforms of FIG. 16.

First, in the initial state (period (1)), ERASE* is set at "H", $\overline{\text{ERASE}}$* is set at "L", VROW is set at 4V and VBB is set at 0V. Since VBB=0V, the negative potential detecting circuit 28 outputs VBBDET="L (0V)".

Since all of the row address signals in the row decoder of the selected row are set to "H", Ai is set to "H" and $\overline{\text{Ai}}$ is set to "L". At this time, the output signal VAB of the NOR circuit 21 is set to "H" and the output signal VA of the inverter circuit 22 is set to "L". As a result, the MOS transistor MN1 is set into the ON state and the MOS transistor MN2 is set into the OFF state.

At this time, VL1 is set to the ground potential (0V) and the MOS transistor MPH2 is set into the ON state. Further, since the MOS transistor MPH2 is set into the ON state, VL2 is set equal to VROW' (=VROW=4V) and the MOS transistor MPH1 is set into the OFF state.

Since the ground potential (0V) is input to the gate of the MOS transistor MP11, the MOS transistor MP11 is set into the ON state. Therefore, the potential VM1 of the node A of the latch circuit is charged to VROW' (=4V). Further, since VROW' is input to the gate of the MOS transistor MP22, the MOS transistor MP22 is set into the OFF state.

Therefore, in the latch circuit, VM1="H (=VROW'=4V)" and VM2 ="L (=VBB=0V)" are stably held.

Since all of the row address signals are not set to "H" in the row decoder of the non-selected row, Ai is set to "L" and $\overline{\text{Ai}}$ is set to "H". At this time, the output signal VAB of the NOR circuit 21 is set to "L" and the output signal VA of the inverter circuit 22 is set to "H". As a result, the MOS transistor MN1 is set into the OFF state and the MOS transistor MN2 is set into the ON state.

At this time, VL2 is set to the ground potential (0V) and the MOS transistor MPH1 is set into the ON state. Further, since the MOS transistor MPH1 is set into the ON state, VL1 is set equal to VROW' (=VROW=4V) and the MOS transistor MPH2 is set into the OFF state.

Since the ground potential (0V) is input to the gate of the MOS transistor MP22, the MOS transistor MP22 is set into the ON state. Therefore, the potential VM2 of the node B of the latch circuit is charged to VROW' (=4V). Further, since VROW' is input to the gate of the MOS transistor MP11, the MOS transistor MP11 is set into the OFF state.

Therefore, in the latch circuit, VM1 ="L (=VBB0V)" and VM2 "H (=VROW' 4V)" are stably held.

After this, if ERASE is changed from "L" to "H", the potential generating circuit (booster or charge pump circuit) 26 gradually lowers VBB from 0V towards −9V (period (2)).

At this time, in the conventional case, a leak current flows from the ground node VSS towards the VBB terminal and a complicated control method for preventing the leak current flow is required.

In the present example, since the output signal of the level shifter is input to the gates of the P-channel MOS transistors MP11, MP22, a leak path extending from the ground node VSS to the VBB terminal does not occur, thereby making it possible to prevent the leak current from flowing.

Further, in the present example, since the leak current can be prevented simply by inputting the output signal of the level shifter to the gates of the P-channel MOS transistors MP11, MP22, the control signal (corresponding to $\overline{\text{VBBDET}}$ of the conventional case) for preventing the leak current becomes unnecessary and time for the design can be shortened and the chip area can be reduced by simplifying the control circuit.

Further, in the present example, since the control signal such as $\overline{\text{VBBDET}}$ of the conventional case becomes unnecessary, the load of the potential generating circuit (booster or charge pump circuit) can be alleviated and the speed of the erase operation can be enhanced.

In the period (3), that is, when VBB becomes lower than −4V, the negative potential detecting circuit 28 changes VBBDET from "L" to "H". At this time, VROW (=VROW') is changed from 4V to 0V. That is, the "H" levels of the inverter circuits INV1, INV2 are set to 0V and the "L" levels thereof are set to VBB.

Since the power supply voltage of the level shifter (MN1, MN2, MPH1, MPH2) is set to 0V if VROW is set to 0V, the values of the outputs VL1, VL2 thereof become indefinite.

For example, since the MOS transistor MN2 is set in the OFF state on the selected row, the value of VL2 becomes indefinite if the MOS transistor MPH2 is set into the OFF state. However, since the potential VM2 of the node B of the latch circuit is set to "H (=0V)" if VROW is set to 0V, data of the latch circuit will not be indefinite. In this case, VL1 keeps the ground potential and does not become indefinite since the MOS transistor MN1 is set in the ON state.

Likewise, since the MOS transistor MN1 is set in the OFF state on the non-selected row, the value of VL1 becomes indefinite if the MOS transistor MPH1 is set into the OFF state. However, since the potential VM1 of the node A of the latch circuit is set to "H (=0V)" if VROW is set to 0V, data of the latch circuit will not be indefinite. In this case, VL2 keeps the ground potential and does not become indefinite since the MOS transistor MN2 is set in the ON state.

The technique for preventing the outputs VL1, VL2 of the level shifter (MN1, MN2, MPH1, MPH2) from becoming indefinite when VROW is set to 0V is explained later.

The reason why the values of VBBDET and VROW are changed with VBB of −4V set as a boundary is to prevent the maximum value of the voltage stress applied to the inverter circuits INV1, INV2 from exceeding 9V. That is, the voltage stress at the changeover point is set to VROW (=4V)−VBB (=−4V) =8V.

After this, if VBB becomes −9V, a potential of "L (=−9V)" is applied to the word line on the selected row. If the potential is kept applied to the word line on the selected row for a preset period of time, electrons in the floating gate electrode of the selected memory cell are discharged into the substrate or source.

At this time, a voltage applied to the inverter circuits INV1, INV2 is set to VROW (=0V)−VBB (=−9V)=9V. The voltage is the same as the voltage applied to the inverter circuits INV1, INV2 at the program time.

When ERASE is set to "L", the erase operation is terminated and the potential generating circuit (booster or charge pump circuit) 26 raises VBB from −9V to the ground potential (0V).

In the period (4), that is, when VBB exceeds −4V, the negative potential detecting circuit 28 changes VBBDET from "H" to "L". At this time, VROW (=VROW') is returned to 4V from 0V.

The state set when VBB is set to 0V (period (5)) is the same as the initial state (the state of the period (1)), and the above erase operation is repeatedly effected according to the sequence of FIG. 7, for example, until the erase operation for all of the memory cells is completed.

Verify Operation (Read Operation)

The signal waveforms of FIG. 17 can be applied to the explanation of the verify operation and the verify operation is explained with reference to the signal waveforms of FIG. 17.

First, ERASE* is set to "L", $\overline{\text{ERASE*}}$ is set to "H", VROW is set to 4V and VBB is set to −2V. Since VBB=−2V, the negative potential detecting circuit outputs VBBDET= "L".

Since all of the row address signals in the row decoder RD•i of the selected row are set to "H", Ai is set to "H" and $\overline{Ai}$ is set to "L". At this time, the output signal VAB of the NOR circuit 21 is set to "L" and the output signal VA of the inverter circuit 22 is set to "H". As a result, the MOS transistor MN1 is set into the OFF state and the MOS transistor MN2 is set into the ON state.

At this time, VL2 is set to the ground potential (0V) and the MOS transistor MPH1 is set into the ON state. Further, since the MOS transistor MPH1 is set into the ON state, VL1 is set equal to VROW' (=VROW=4V) and the MOS transistor MPH2 is set into the OFF state.

Since the ground potential (0V) is input to the gate of the MOS transistor MP22, the MOS transistor MP22 is set into the ON state. Therefore, the potential VM2 of the node B of the latch circuit is charged to VROW' (=4V). Further, since VROW' is input to the gate of the MOS transistor MP11, the MOS transistor MP11 is set into the OFF state.

Therefore, in the latch circuit, "L (=VBB=−2V)" is stably held in the node A and "H (=VROW'=4V)" is stably held in the node B. Then, the potential VM2 of the node B of the latch circuit is applied to the word line of the selected memory cell to read data.

Since all of the row address signals are not set to "H" in the row decoder of the non-selected row, Ai is set to "L" and $\overline{Ai}$ is set to "H". At this time, the output signal VAB of the NOR circuit 21 is set to "H" and the output signal VA of the inverter circuit 22 is set to "L". As a result, the MOS transistor MN1 is set into the ON state and the MOS transistor MN2 is set into the OFF state.

At this time, VL1 is set to the ground potential (0V) and the MOS transistor MPH2 is set into the ON state. Further, since the MOS transistor MPH2 is set into the ON state, VL2 is set equal to VROW' (=VROW=4V) and the MOS transistor MPH1 is set into the OFF state.

Since the ground potential (0V) is input to the gate of the MOS transistor MP11, the MOS transistor MP11 is set into the ON state. Therefore, the potential VM1 of the node A of the latch circuit is charged to VROW' (=4V). Further, since VROW' is input to the gate of the MOS transistor MP22, the MOS transistor MP22 is set into the OFF state.

Therefore, in the latch circuit, "H (=VROW'=4V)" is stably held in the node A and "L (=VBB=0V)" is stably held in the node B. Then, the potential VM2 of the node B of the latch circuit is applied to the word lines of the non-selected memory cells to inhibit reading of data.

As described above, the level shift circuit of this invention can alleviate the voltage stress applied to the MOS transistor by using the latch circuit and, for example, it can be applied to a decode circuit of a flash EEPROM in which high-speed random access is required. In the flash EEPROM, a positive high potential and a negative high potential are necessary at the program or erase time, but enhancement of the performance and a reduction in the film thickness of the gate oxide film of the MOS transistor can be attained by alleviating the voltage stress applied to the MOS transistor. Further, the MOS transistor can be miniaturized, the area of the decode circuit can be reduced and the cost thereof can be lowered.

Further, in this invention, the output signal of the level shifter is input to the gates of the P-channel MOS transistors MP11, MP22. Therefore, no leak current will occur even if one of the two nodes A, B of the latch circuit is set to a negative potential.

Further, since the control signal (corresponding to $\overline{VBBDET}$ of the conventional case) for preventing the leak current is unnecessary, time for the design can be shortened and the erase time can be shortened by simplifying the control circuit. Further, in the present example, since a signal such as $\overline{VBBDET}$ of the conventional case is unnecessary, the load of the potential generating circuit (booster or charge pump circuit) can be alleviated and the operation speed can be enhanced.

Figure 19:
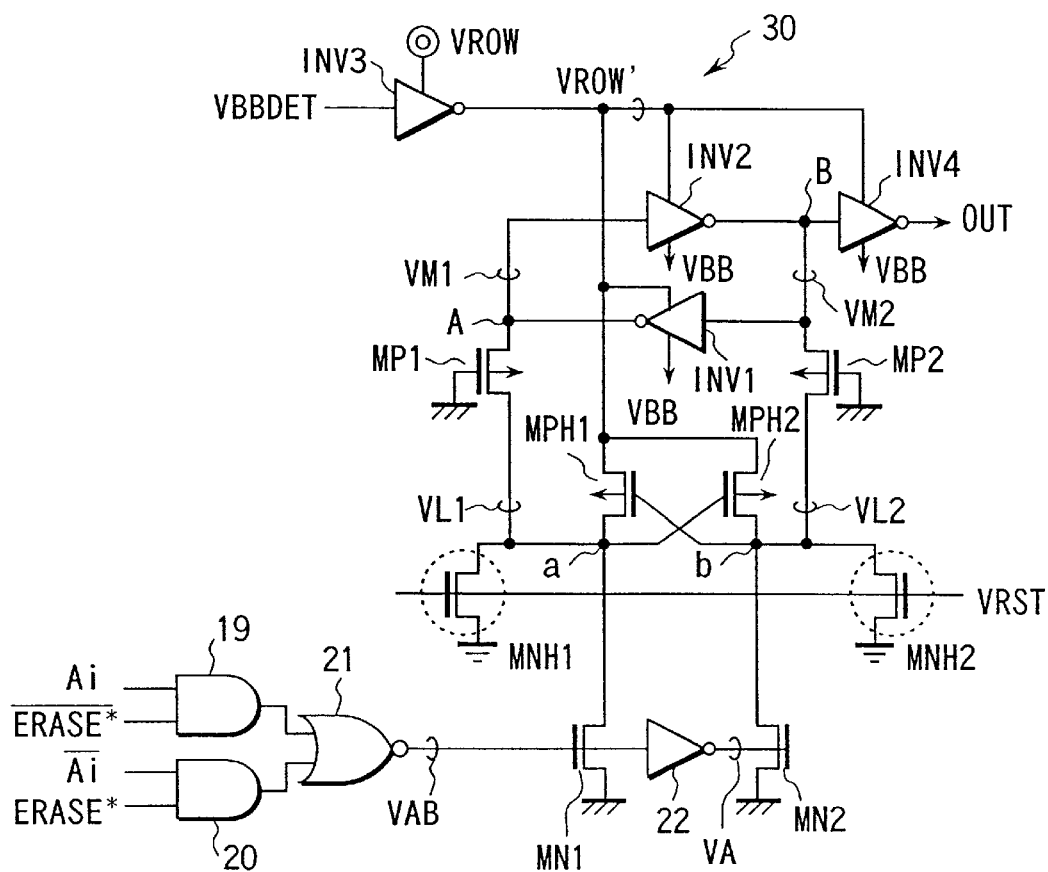
FIG. 19 is a diagram showing a modification of the level shift circuit.

FIG. 19 is a modification of the latch type level shift circuit shown in FIG. 15.

When the latch type level shift circuit of the present example is compared with the level shift circuit of FIG. 15, the connection of N-channel MOS transistors MNH1, MNH2 between the output terminals a, b of the level shifter and the ground node VSS is new.

A control signal VRST is input to the gates of the MOS transistors MNH1, MNH2. The MOS transistors MNH1, MNH2 play a role for fixing the output terminals a, b of the level shifter at the ground potential when VROW' is set at the ground potential. In this case, since the potentials of the output terminals a, b of the level shifter do not become indefinite and the MOS transistors MP1, MP2 can be completely set into the OFF state when VROW' is set at the ground potential, high stability of the latch circuit can be attained.

Figure 20:
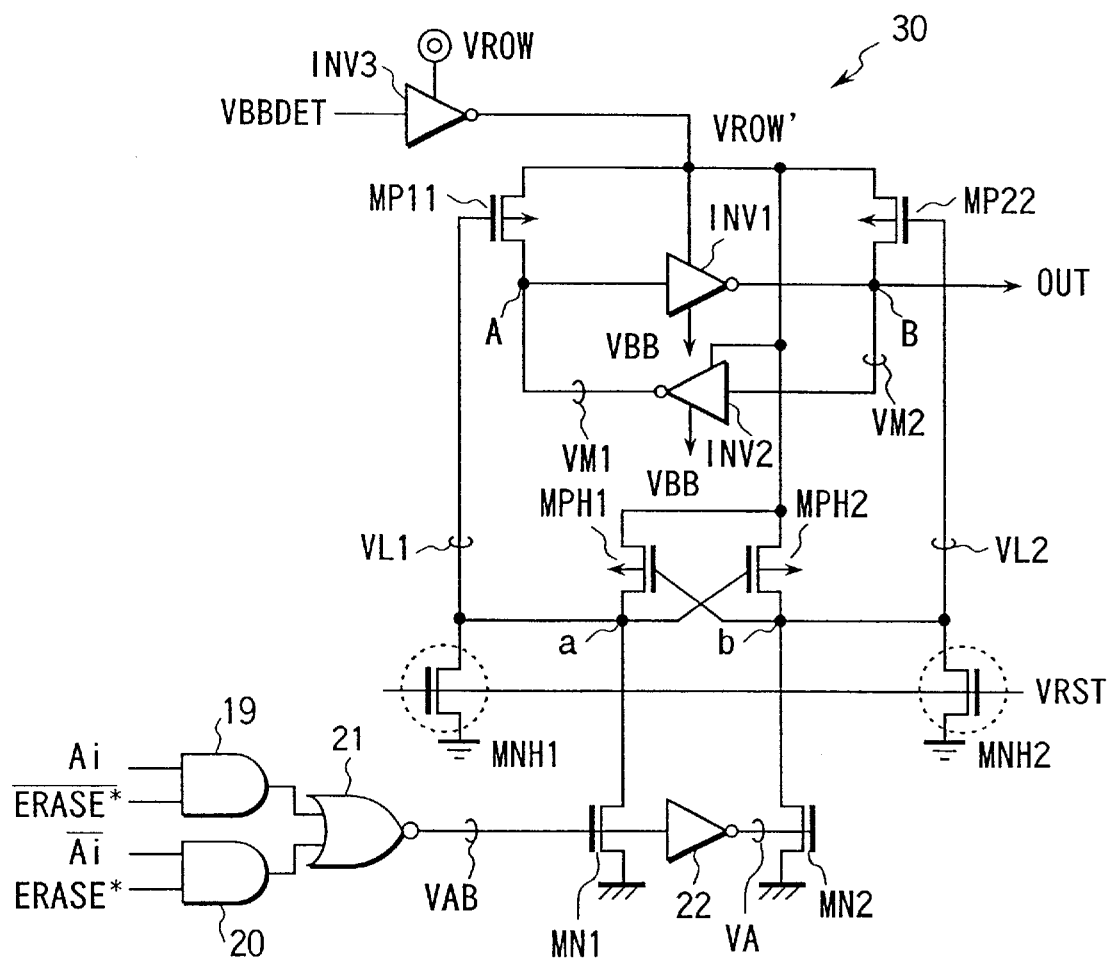
FIG. 20 is a diagram showing another modification of the level shift circuit.

FIG. 20 is a modification of the latch type level shift circuit shown in FIG. 18.

When the latch type level shift circuit of the present example is compared with the level shift circuit of FIG. 18, the connection of N-channel MOS transistors MNH1, MNH2 between the output terminals a, b of the level shifter and the ground node VSS is new.

A control signal VRST is input to the gates of the MOS transistors MNH1, MNH2. The MOS transistors MNH1, MNH2 play a role for fixing the output terminals a, b of the level shifter at the ground potential when VROW' is set at the ground potential. In this case, since the potentials of the output terminals a, b of the level shifter do not become indefinite and the MOS transistors MP11, MP12 can be completely set into the OFF state when VROW' is set at the ground potential, high stability of the latch circuit can be attained.

FIGS. 21 to 26 show a circuit for generating the control signal VRST used in each of the latch type level shift circuits of FIGS. 19 and 20 and timings of various signals.

The MOS transistors MNH1, MNH2 of FIGS. 19, 20 are used to fix the output terminals a, b of the level shifter at the ground potential when VROW' is set at the ground potential and attain high stability of the latch circuit.

However, the stable operation of the latch circuit may be affected if the timing at which the output terminals a, b of the level shifter are set to the ground potential is earlier than the timing at which VROW' is set to the ground potential or if the output terminals a, b of the level shifter are kept fixed at the ground potential even after VROW' is returned to the power supply potential Vdd (=4V).

Therefore, in the present example, a circuit for effecting the timing control of "H" and "L" of the control signal VRST for causing the timing at which the output terminals a, b of the level shifter are set to the ground potential to be always later than the timing at which VROW' is set to the ground potential and causing the output terminals a, b of the level shifter to be disconnected from the ground node VSS before VROW' is returned to the power supply potential Vdd (=4V) is proposed.

Figure 21:
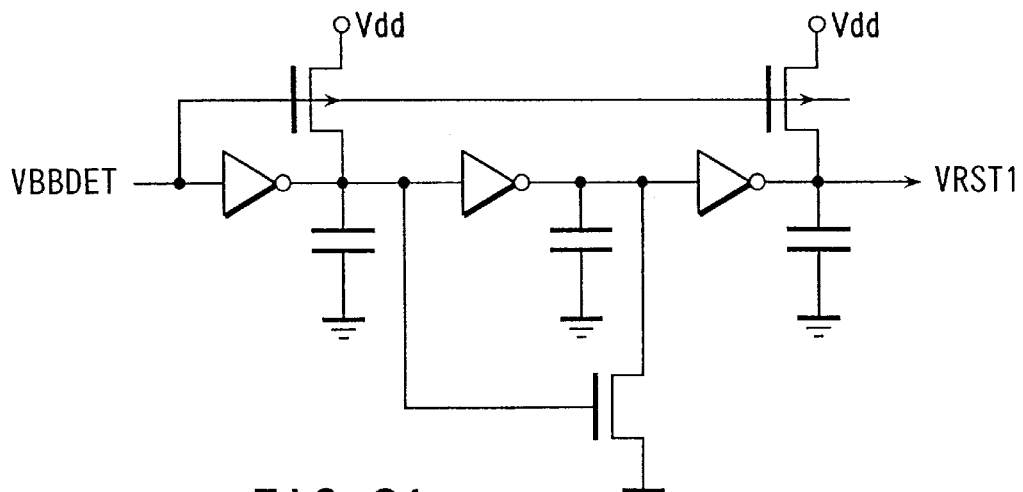
FIG. 21 is a diagram showing part of a circuit for generating VRST1.
Figure 22:
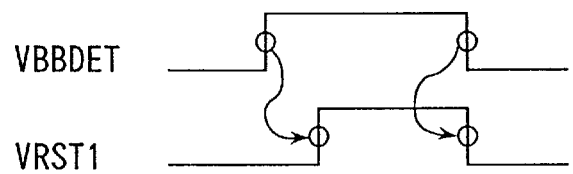
FIG. 22 is a diagram showing signal waveforms in the circuit of FIG. 21.

A circuit of FIG. 21 has a function of a delay circuit for delaying the rise timing of VBBDET by a preset time and outputting the delayed signal as VRST1. The concrete timings are shown in FIG. 22.

Figure 23:
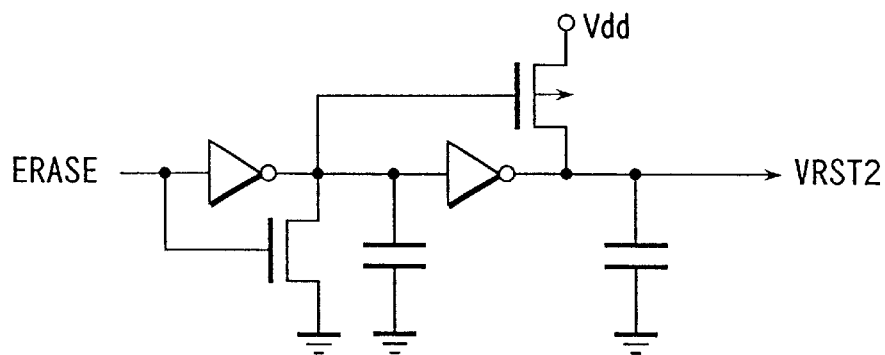
FIG. 23 is a diagram showing part of a circuit for generating VRST2.
Figure 24:
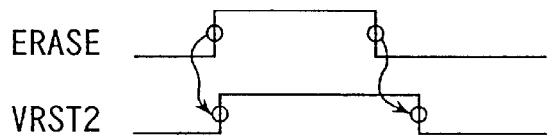
FIG. 24 is a diagram showing signal waveforms in the circuit of FIG. 23.

A circuit of FIG. 23 has a function of a delay circuit for delaying the fall timing of ERASE by a preset time and outputting the delayed signal as VRST2. The concrete timings are shown in FIG. 24.

Figure 25:
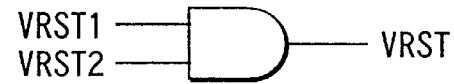
FIG. 25 is a diagram showing part of a circuit for generating VRST.

A circuit of FIG. 25 has a function of generating the control signal VRST from VRST1 and VRST2. The control signal VRST is applied to the gates of the MOS transistors MNH1, MNH2 of FIGS. 19 and 20.

Figure 26:
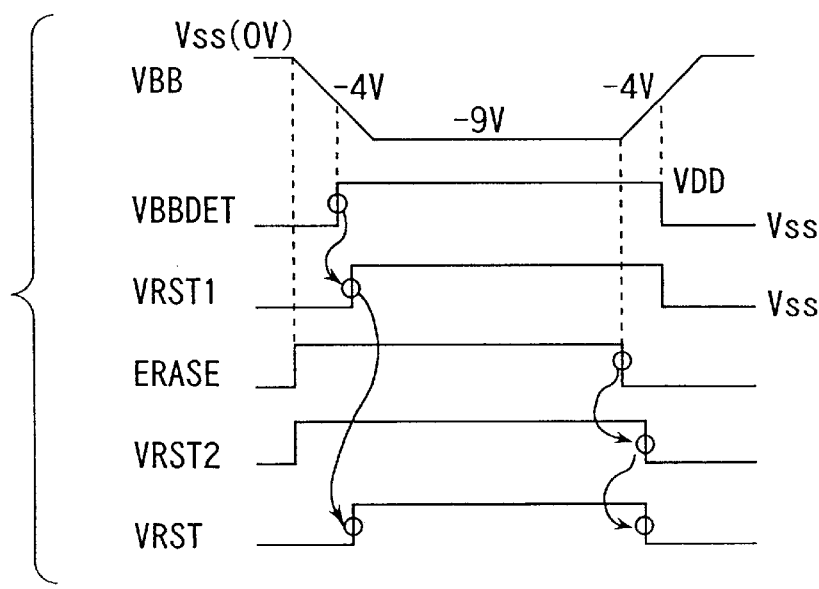
FIG. 26 is a diagram showing signal waveforms in the circuits of FIGS. 21, 23 and 25.

FIG. 26 collectively shows timings of various signals used in FIGS. 21, 23 and 25. As is clearly understood from the drawing, the period in which the control signal VRST is set at "H", that is, the period in which the output terminals a, b of the level shifter are fixed at the ground potential is completely contained in the period in which VBBDET is set at "H", that is, the period in which VROW' is fixed at the ground potential by the MOS transistors MNH1, MNH2.

Thus, according to the present example, high stability of the latch circuit can be attained.

As described above, according to the latch type level shift circuit of this invention, first, the voltage stress applied to the MOS transistor can be alleviated, and a reduction in the film thickness of the gate oxide film of the MOS transistor and enhancement of the performance thereof can be attained since it is a latch type. Further, miniaturization of the MOS transistors, a reduction in the area of the decode circuit and a lowering in the cost thereof can be simultaneously attained.

Second, in this invention, the P-channel MOS transistor whose gate is grounded is connected between the level shifter and the latch circuit or the output signal of the level shifter is input to the gate of the P-channel MOS transistor. Therefore, no leak path will occur even when one of the two nodes A and B of the latch circuit is set to a negative potential at the time of erase operation or verify operation (read operation), thereby making it possible to attain the stable operation of the latch circuit.

Further, since the control signal (corresponding to $\overline{\text{VBBDET}}$ in the conventional case) for preventing the leak current becomes unnecessary, the erase time can be shortened, the circuit area can be reduced and time for the design can be shortened by simplifying the control circuit. Further, in this invention, since the control signal such as $\overline{\text{VBBDET}}$ of the conventional case becomes unnecessary, the load of the potential generating circuit (booster or charge pump circuit) can be alleviated and the operation speed can be enhanced.

Third, the N-channel MOS transistor which is set in the ON state when VROW' is set at the ground potential (VBB is less than −4V) is connected between the output terminal of the level shifter and the ground node VSS. Therefore, even if VROW' is set to the ground potential, the potential of the output terminal of the level shifter will not become indefinite and high stability of the latch circuit can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A latch type level shift circuit comprising:
   an internal power supply potential generating circuit generating first and second internal power supply potentials;
   a latch circuit having first and second nodes and driven by the first and second internal power supply potentials;
   a level shifter having first and second output terminals and driven by the first internal power supply potential and a fixed potential;
   a first MOS transistor having a gate applied with the fixed potential and connected between the first node and the first output terminal; and
   a second MOS transistor having a gate applied with the fixed potential and connected between the second node and the second output terminal.

2. The latch type level shift circuit according to claim 1, wherein said internal power supply potential generating circuit changes the values of the first and second internal power supply potentials by setting the first internal power supply potential to the fixed potential and by setting the second internal power supply potential to a negative potential at the time of an erase operation.

3. The latch type level shift circuit according to claim 2, further comprising a switch circuit setting both of the first and second output terminals to the fixed potential when the first internal power supply potential is set at the fixed potential.

4. The latch type level shift circuit according to claim 1, wherein said internal power supply potential generating circuit changes the values of the first and second internal power supply potentials and sets the second internal power supply potential to a negative potential at the time of a read operation.

5. The latch type level shift circuit according to claim 1, wherein said latch circuit includes two inverter circuits connected in a flip-flop configuration and said two inverter circuits are driven by the first and second internal power supply potentials.

6. The latch type level shift circuit according to claim 1, wherein said level shifter includes third and fourth MOS transistors serially connected and fifth and sixth-MOS transistors serially connected, the gate of said fifth MOS transistor is connected to a first connection node of said third and fourth MOS transistors, the gate-of said third MOS transistor is connected to a second connection node of said fifth and sixth MOS transistors, and said first and second connection nodes are respectively used as the first and second output terminals.

7. The latch type level shift circuit according to claim 6, further comprising a logic circuit for determining data held in said latch circuit by selectively setting one of said fourth and sixth MOS transistors into the ON state.

8. The latch type level shift circuit according to claim 7, wherein the latch type level shift circuit is used in a decode circuit of a flash memory and said logic circuit selectively sets one of said fourth and sixth MOS transistors into the ON state based on an address signal and an operation mode of the flash memory.

9. A latch type level shift circuit comprising:
   an internal power supply potential generating circuit generating first and second internal power supply potentials;
   a latch circuit having first and second nodes and driven by the first and second internal power supply potentials;
   a level shifter having first and second output terminals and driven by the first internal power supply potential and a fixed potential;
   a first MOS transistor having a gate connected to the first output terminal and having a function of supplying the first internal power supply potential to the first node when said first MOS transistor is set into the ON state; and
   a second MOS transistor having a gate connected to the second output terminal and having a function of supplying the first internal power supply potential to the second node when said second MOS transistor is set into the ON state.

10. The latch type level shift circuit according to claim 9, wherein said internal power supply potential generating circuit changes the values of the first and second internal power supply potentials by setting the first internal power supply potential to the fixed potential and by setting the second internal power supply potential to a negative potential at the time of an erase operation.

11. The latch type level shift circuit according to claim 10, further comprising a switch circuit setting both of the first and second output terminals to the fixed potential when the first internal power supply potential is set at the fixed potential.

12. The latch type level shift circuit according to claim 9, wherein said internal power supply potential generating circuit changes the values of the first and second internal power supply potentials and sets the second internal power supply potential to a negative potential at the time of a read operation.

13. The latch type level shift circuit according to claim 9, wherein said latch circuit includes two inverter circuits connected in a flip-flop configuration and said two inverter circuits are driven by the first and second internal power supply potentials.

14. The latch type level shift circuit according to claim 9, wherein said level shifter includes third and fourth MOS transistors serially connected and fifth and sixth MOS transistors serially connected, the gate of said fifth MOS transistor is connected to a first connection node of said third and fourth MOS transistors, the gate of said third MOS transistor is connected to a second connection node of said fifth and sixth MOS transistors, and said first and second connection nodes are respectively used as the first and second output terminals.

15. The latch type level shift circuit according to claim 14, further comprising a logic circuit for determining data held in said latch circuit by selectively setting one of said fourth and sixth MOS transistors into the ON state.

16. The latch type level shift circuit according to claim 15, wherein the latch type level shift circuit is used in a decode circuit of a flash memory and said logic circuit selectively sets one of said fourth and sixth MOS transistors into the ON state based on an address signal and an operation mode of the flash memory.

17. A latch type level shift circuit in which first and second power supply potentials supplied from an exterior of a chip to an interior thereof and third and fourth power supply potentials generated in the chip are used, comprising:

a latch circuit having first and second nodes, outputting one of the third power supply potential as a high level and the fourth power supply potential as a low level to the first node, and outputting the other one of the third power supply potential as the high level and the fourth power supply potential as the low level to the second node;

a logic circuit outputting the first power supply potential as a high logic level and outputting the second power supply potential as a low logic level;

a level shifter having first and second output terminals, converting the first power supply potential output from said logic circuit to the third power supply potential, outputting one of the third power supply potential as a high output level and the second power supply potential as a low output level to the first output terminal, and outputting the other one of the third power supply potential as the high output level and the second power supply potential as the low output level to the second output terminal;

a first MOS transistor connected between the first node and the first output terminal;

a second MOS transistor connected between the second node and the second output terminal; and an internal power supply potential generating circuit generating the third and fourth power supply potentials and having a function of changing the values of the third and fourth power supply potentials;

wherein a potential of a substrate in which both of said first and second MOS transistors are formed varies according to the values of the third and fourth power supply potentials.

18. The latch type level shift circuit according to claim 17, wherein the gates of said first and second MOS transistors are applied with a fixed potential.

19. The latch type level shift circuit according to claim 17, wherein said internal power supply potential generating circuit sets the third power supply potential to a fixed potential and sets the fourth power supply potential to a negative potential at the time of an erase operation.

20. The latch type level shift circuit according to claim 19, further comprising a switch circuit setting both of the first and second output terminals to the fixed potential when the third power supply potential is set at the fixed potential.

21. The latch type level shift circuit according to claim 17, wherein said internal power supply potential generating circuit sets the fourth power supply potential to a negative potential at the time of a read operation.

22. The latch type level shift circuit according to claim 17, wherein said latch circuit includes two inverter circuits connected in a flip-flop configuration and said two inverter circuits are driven by the third and fourth power supply potentials.

23. The latch type level shift circuit according to claim 17, wherein said level shifter includes third and fourth MOS transistors serially connected and fifth and sixth MOS transistors serially connected, the gate of said fifth MOS transistor is connected to a first connection node of said third and fourth MOS transistors, the gate of said third MOS transistor is connected to a second connection node of said fifth and sixth MOS transistors, and said first and second connection nodes are respectively used as the first and second output terminals.

24. The latch type level shift circuit according to claim 23, wherein said logic circuit determines data held in said latch circuit by selectively setting one of said fourth and sixth MOS transistors into the ON state.

25. The latch type level shift circuit according to claim 24, wherein the latch type level shift circuit is used in a decode circuit of a flash memory and said logic circuit selectively sets one of said fourth and sixth MOS transistors into the ON state based on an address signal and an operation mode of the flash memory.

26. The latch type level shift circuit according to claim 17, wherein the first power supply potential is a first positive potential, the second power supply potential is a ground potential, the third power supply potential is a second positive potential or ground potential, and the fourth power supply potential is the ground potential or a negative potential.

27. The latch type level shift circuit according to claim 26, wherein the third power supply potential is set to one of the second positive potential and the ground potential by said internal power supply potential generating circuit and the fourth power supply potential is set to one of the ground potential and the negative potential by said internal power supply potential generating circuit.

28. The latch type level shift circuit according to claim 27, wherein the fourth power supply potential is set at the ground potential when the third power supply potential is set at the second positive potential and the fourth power supply potential is set at the negative potential when the third power supply potential is set at the ground potential.

* * * * *